(12) United States Patent
Zhou et al.

(10) Patent No.: US 7,061,949 B1
(45) Date of Patent: Jun. 13, 2006

(54) METHODS, APPARATUS, AND SYSTEMS WITH SEMICONDUCTOR LASER PACKAGING FOR HIGH MODULATION BANDWIDTH

(75) Inventors: Michael Zhou, Thousand Oaks, CA (US); Die-Chi Sun, Thousand Oaks, CA (US); Kee-Sin Tan, Westlake Village, CA (US); Wenbin Jiang, Thousand Oaks, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 216 days.

(21) Appl. No.: 10/640,972

(22) Filed: Aug. 13, 2003

Related U.S. Application Data

(60) Provisional application No. 60/403,998, filed on Aug. 16, 2002.

(51) Int. Cl.
    H01S 3/04 (2006.01)

(52) U.S. Cl. ............................................. 372/36

(58) Field of Classification Search ................. 372/36; 257/81, 99, 100
    See application file for complete search history.

(56) References Cited

U.S. PATENT DOCUMENTS

| | | | |
|---|---|---|---|
| 3,423,594 A | 1/1969 | Galopin | |
| 3,581,162 A | 5/1971 | Wheatley | |
| 3,771,031 A | 11/1973 | Kay | |
| 3,869,702 A | 3/1975 | Backhouse et al. | |
| 3,872,496 A | 3/1975 | Potter | |
| 4,092,614 A | 5/1978 | Sakuma et al. | |
| 4,097,891 A | 6/1978 | Selway et al. | |
| 4,100,562 A | 7/1978 | Sugawara et al. | |
| 4,125,777 A | 11/1978 | O'Brien et al. | |
| 4,131,911 A | 12/1978 | Fujine et al. | |
| 4,144,504 A | 3/1979 | Leggett et al. | |
| 4,167,744 A | 9/1979 | Nyul | |
| 4,307,934 A | 12/1981 | Palmer | |
| 4,316,204 A | 2/1982 | Inagaki et al. | |
| 4,338,577 A | 7/1982 | Sato et al. | |
| 4,351,051 A | 9/1982 | van Alem et al. | |
| 4,567,598 A | 1/1986 | Noguchi et al. | |
| 4,584,688 A | 4/1986 | Demeure et al. | |
| 4,585,300 A | 4/1986 | Landis et al. | |
| 4,659,170 A | 4/1987 | Wittke | |
| 4,686,678 A | 8/1987 | Ohta et al. | |
| 4,733,094 A | 3/1988 | Carpentier et al. | |

(Continued)

FOREIGN PATENT DOCUMENTS

| JP | 60-88486 | 5/1985 |
|---|---|---|

(Continued)

OTHER PUBLICATIONS

Claisse, P.R., et al., "Automatic Power Control of a VCSEL Using an Angled Lid T056 Package", Electronic Components and Technology Conference, Motorola, (1998), p. 203-209.*

(Continued)

Primary Examiner—Minsun Oh Harvey
Assistant Examiner—Tod T. Van Roy
(74) Attorney, Agent, or Firm—Allen, Dyer, Doppelt, Milbrath & Gilchrist, P.A.

(57) ABSTRACT

Semiconductor packaging methods, systems and apparatus for semiconductor lasers to achieve high modulation bandwidth. Systems, methods and apparatus for minimizing the inductance of wire bond interconnects and impedance matching in a semiconductor laser package. Systems, methods and apparatus for monitoring a photocurrent in order to provide automatic power control (APC) of a semiconductor laser.

14 Claims, 26 Drawing Sheets

U.S. PATENT DOCUMENTS

| | | | |
|---|---|---|---|
| 4,755,474 A | | 7/1988 | Moyer |
| 4,768,070 A | | 8/1988 | Takizawa et al. |
| 4,802,178 A | | 1/1989 | Ury |
| 4,818,099 A | | 4/1989 | Preikschat et al. |
| 4,847,848 A | | 7/1989 | Inoue et al. |
| 4,901,325 A | | 2/1990 | Kato et al. |
| 4,906,839 A | | 3/1990 | Lee |
| 4,912,715 A | | 3/1990 | Aoki et al. |
| 4,937,660 A | * | 6/1990 | Dietrich et al. ............. 257/750 |
| 4,953,171 A | | 8/1990 | Nakajima et al. |
| 5,019,769 A | | 5/1991 | Levinson |
| 5,043,775 A | | 8/1991 | Lee |
| 5,052,005 A | | 9/1991 | Tanaka et al. |
| 5,065,226 A | | 11/1991 | Kluitmans et al. |
| 5,089,861 A | | 2/1992 | Tanaka et al. |
| 5,156,999 A | | 10/1992 | Lee |
| 5,327,443 A | | 7/1994 | Tanaka et al. |
| 5,373,519 A | | 12/1994 | Siono et al. |
| 5,485,479 A | | 1/1996 | Kitamura et al. |
| 5,550,675 A | | 8/1996 | Komatsu |
| 5,631,987 A | | 5/1997 | Lasky et al. |
| 5,636,234 A | | 6/1997 | Takagi |
| 5,771,254 A | * | 6/1998 | Baldwin et al. .............. 372/31 |
| 5,801,402 A | | 9/1998 | Shin |
| 5,838,703 A | | 11/1998 | Lebby et al. |
| 5,905,750 A | | 5/1999 | Lebby et al. |
| 6,236,668 B1 | * | 5/2001 | Osada et al. .................. 372/34 |
| 6,528,825 B1 | * | 3/2003 | Yoshida ...................... 257/81 |
| 6,577,656 B1 | | 6/2003 | Chen et al. |
| 6,586,678 B1 | * | 7/2003 | Rosenberg et al. ........ 174/52.5 |
| 6,707,073 B1 | * | 3/2004 | Yamamoto et al. ........... 257/99 |
| 6,868,104 B1 | * | 3/2005 | Stewart et al. ................ 372/36 |
| 2001/0024551 A1 | | 9/2001 | Yonemura et al. |
| 2002/0136504 A1 | * | 9/2002 | Boscha ........................ 385/91 |

FOREIGN PATENT DOCUMENTS

| | | |
|---|---|---|
| JP | 62-252154 | 11/1987 |
| JP | 02-125688 | 5/1990 |
| JP | 5-299779 | 11/1993 |

OTHER PUBLICATIONS

Claisse, P.R., et al., "Automatic Power Control of a VCSEL Using an Angled Lid T056 Package", Electronic Components and Technology Conference, Motorola, (1998), p. 203-209.

Research Disclosure, Laser Package with Photodiode for Monitoring Laser Power Emitted from the Front Facet:, Kenneth Mason Publications Ltd., England, Disclosed Anonymously, (Jun. 1988), One page.

Abstract Disclosure, "Laser-Power Monitor System for Two-Laser Array", Disclosed Anonymously, (1990), one page.

Abstract Disclosure, "Laser Package e.g. for Optical Storage Disc Servo Electronics", Disclosed Anonymously, (1988), one page.

Abstract Disclosure, "Laser Diode Angular Orientation Sensing Technique", Disclosed Anonymously, (1990), one page.

Parasitic Inductance Effects in the Design of 10Gbps Optical Transmitters, MAXIM High-Frequency/Fiber Communications Group, Application Note: HFAN-2.0.1; Rev 0; Feb. 2002, pp. 1-3.

William I. Orr, Radio Handbook, Howard W. Sams & Company, a division of Macmillan, Inc., 1987, twenty-Third Edition, Third Printing 1988, pp. 21-1 to 21-23.

Herbert L. Krauss and Charles W. Bostian, Solid State Radio Engineering, Department of Electrical Engineering, Virginia Polytech Institute and State University, Blacksburg, VA, John Wiley & Sons, 1980, pp. 417-431.

* cited by examiner

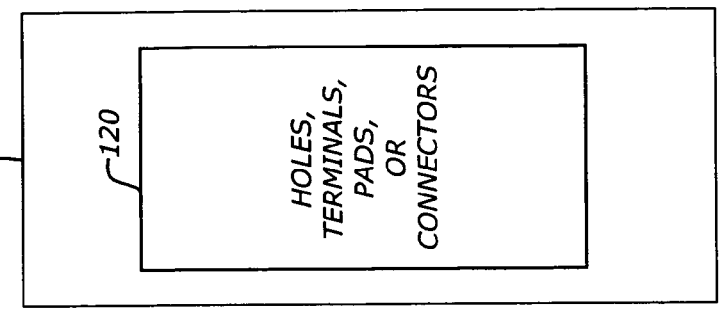
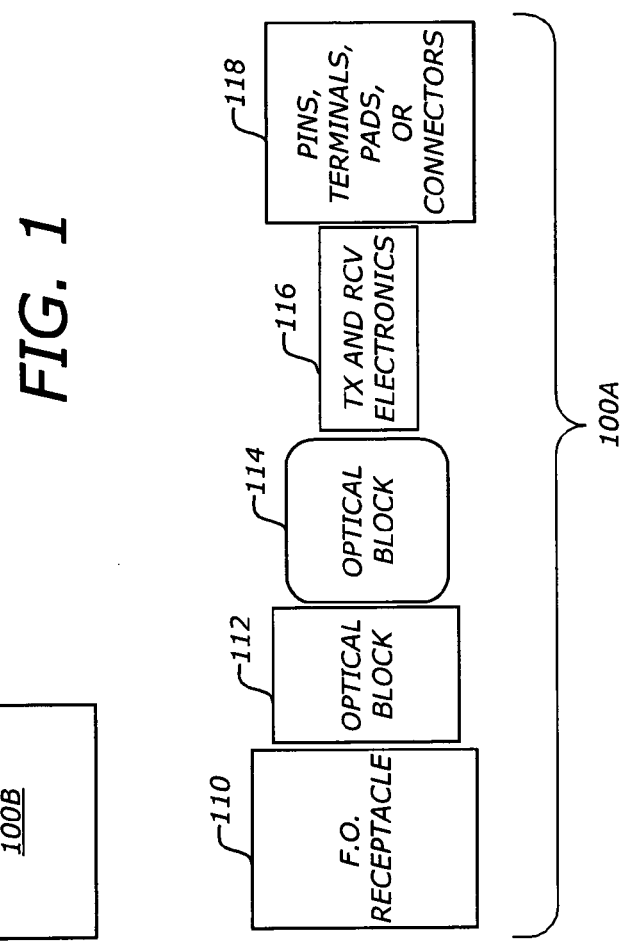
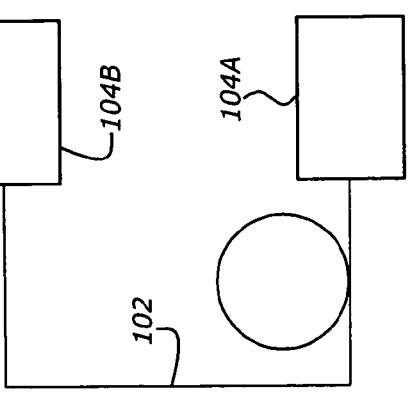
FIG. 1

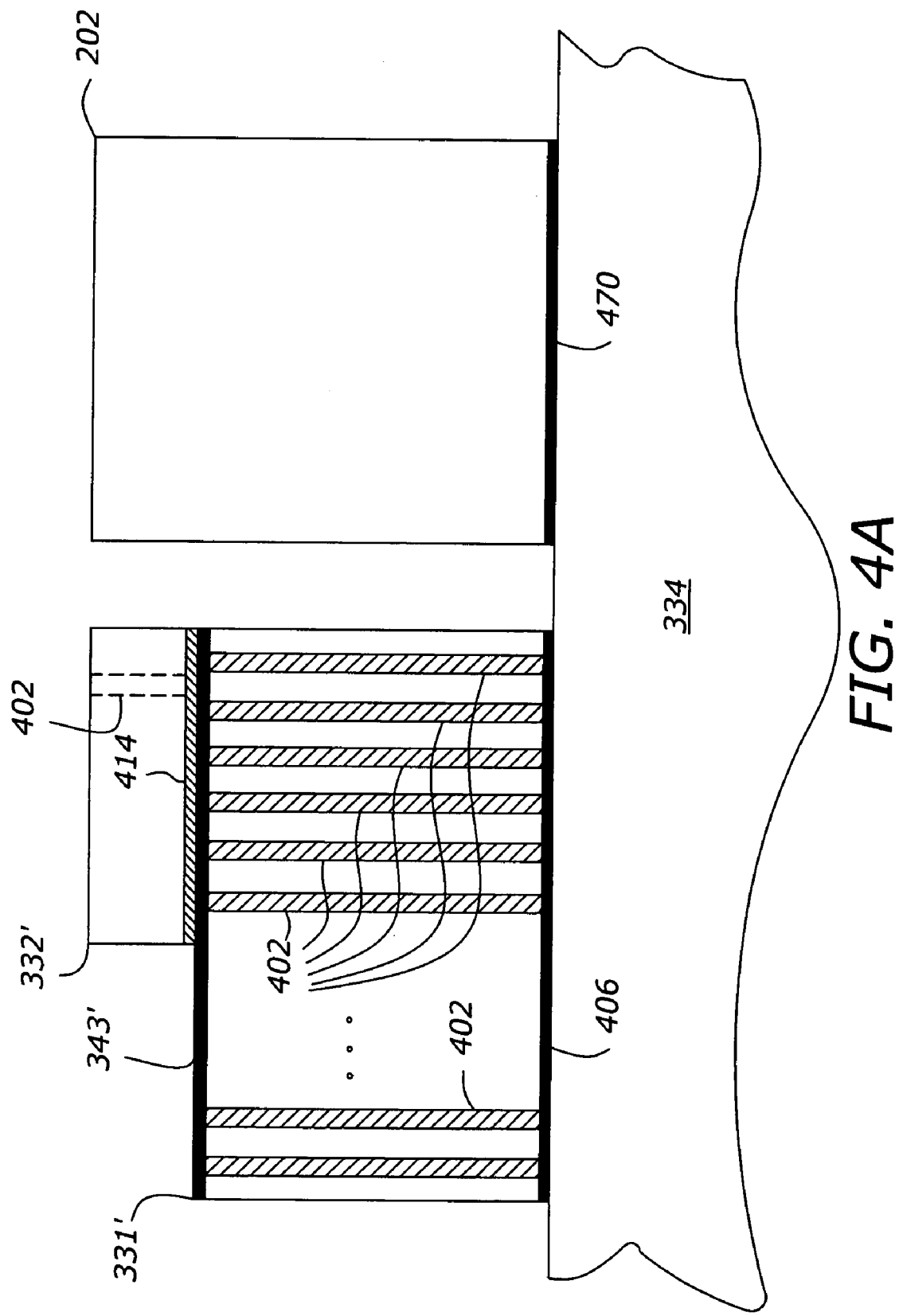

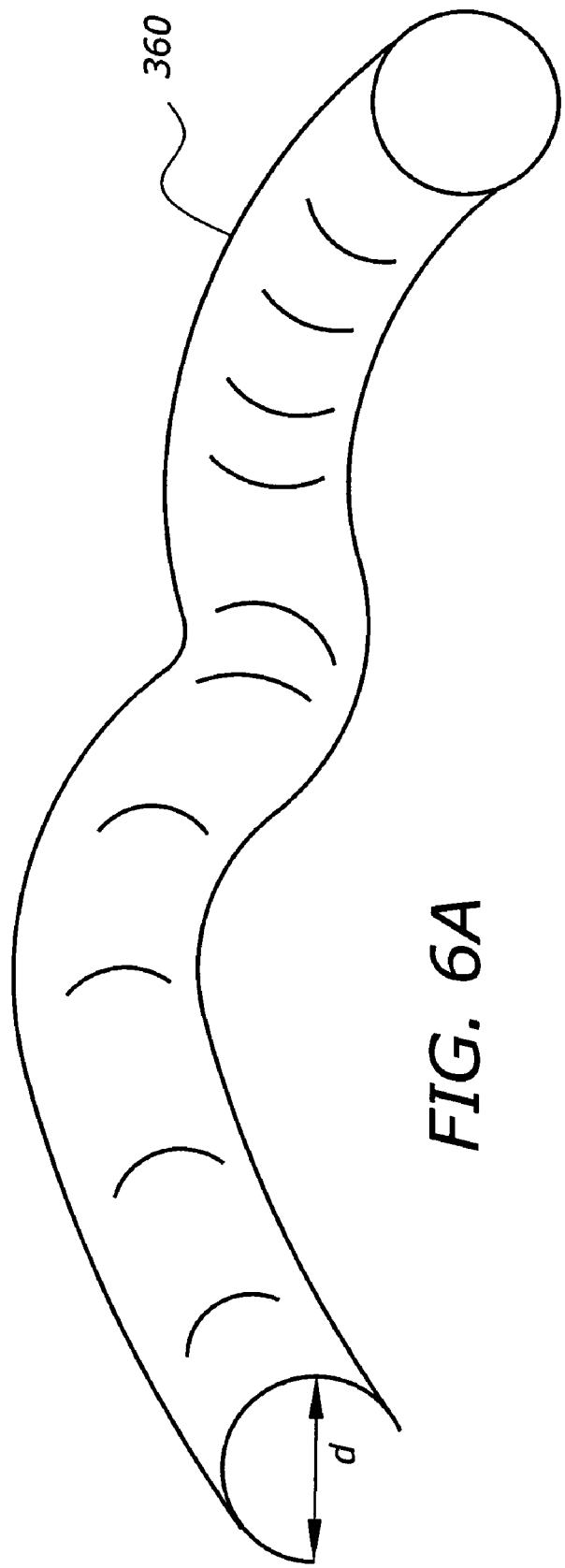

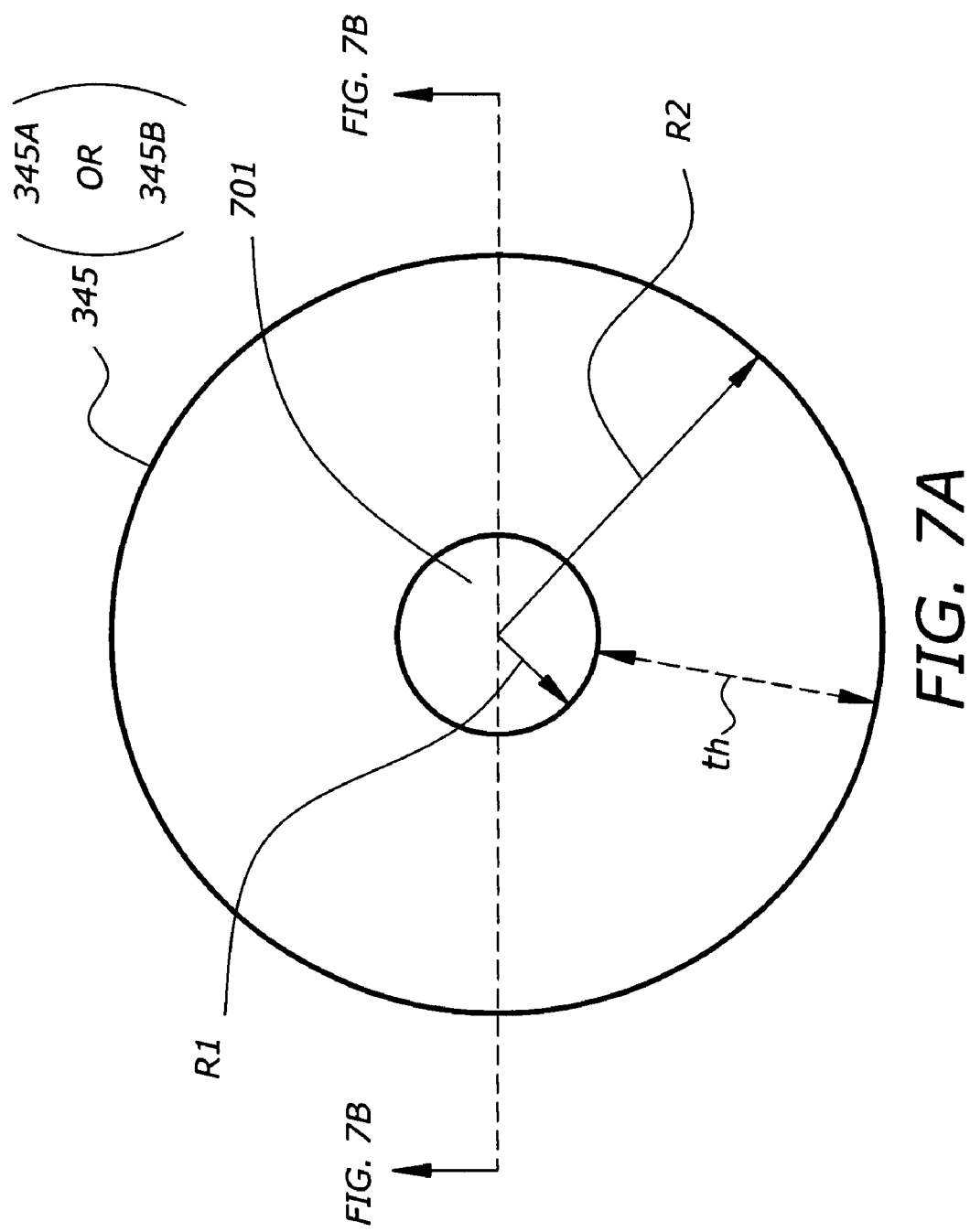

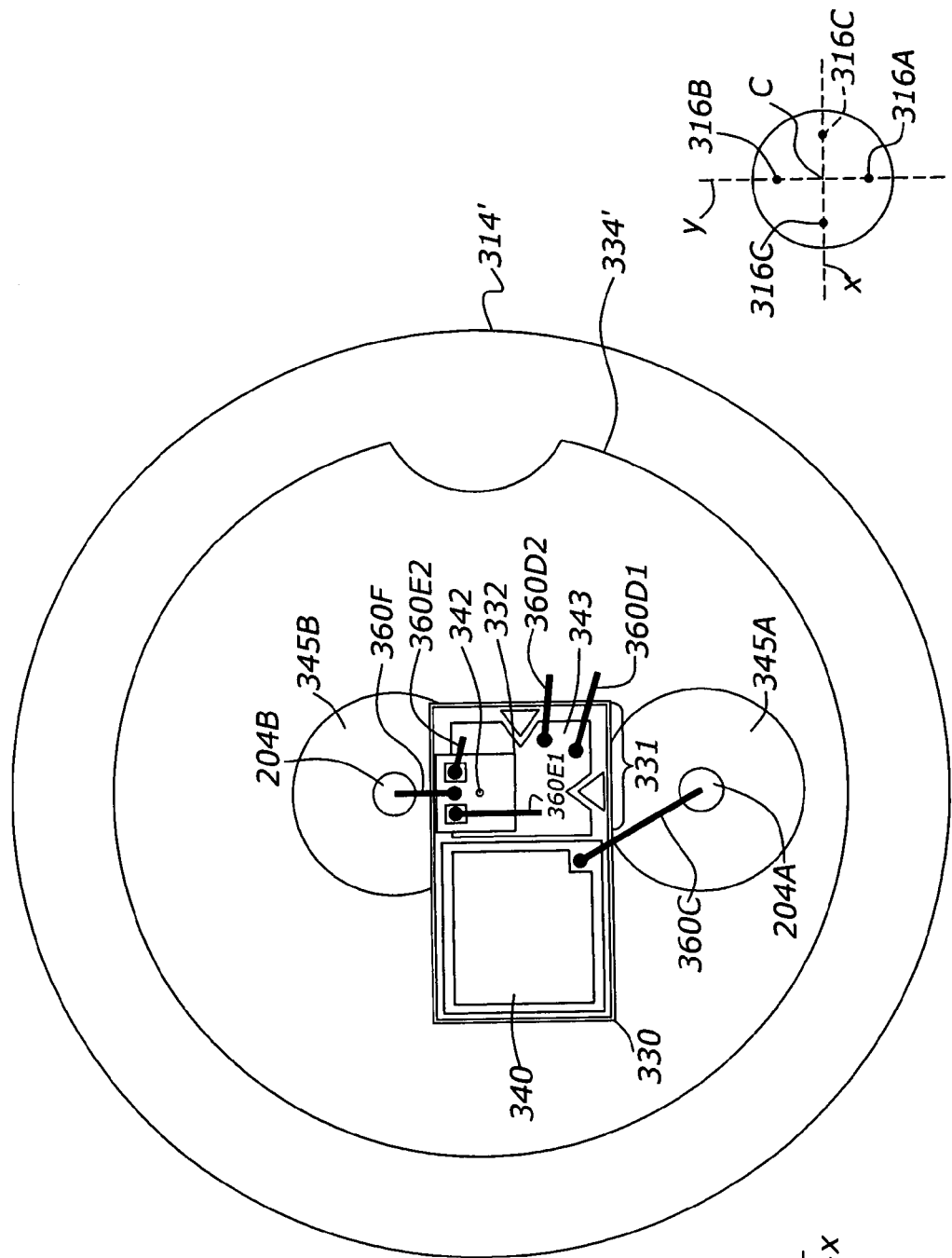
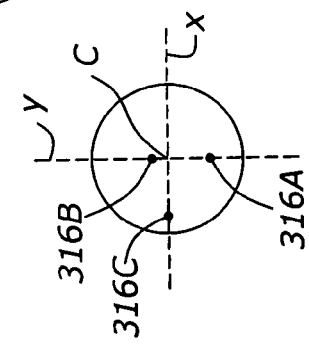

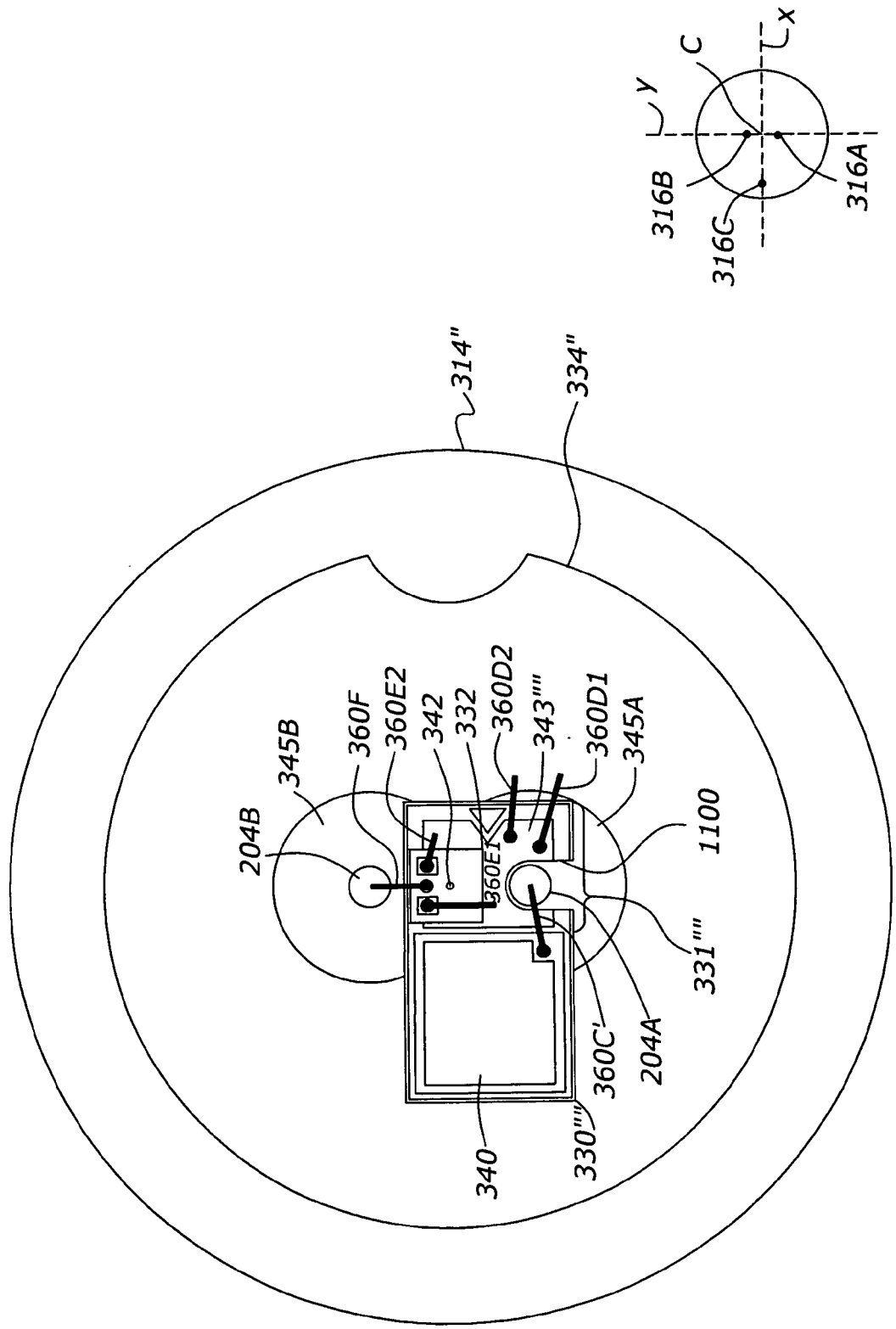

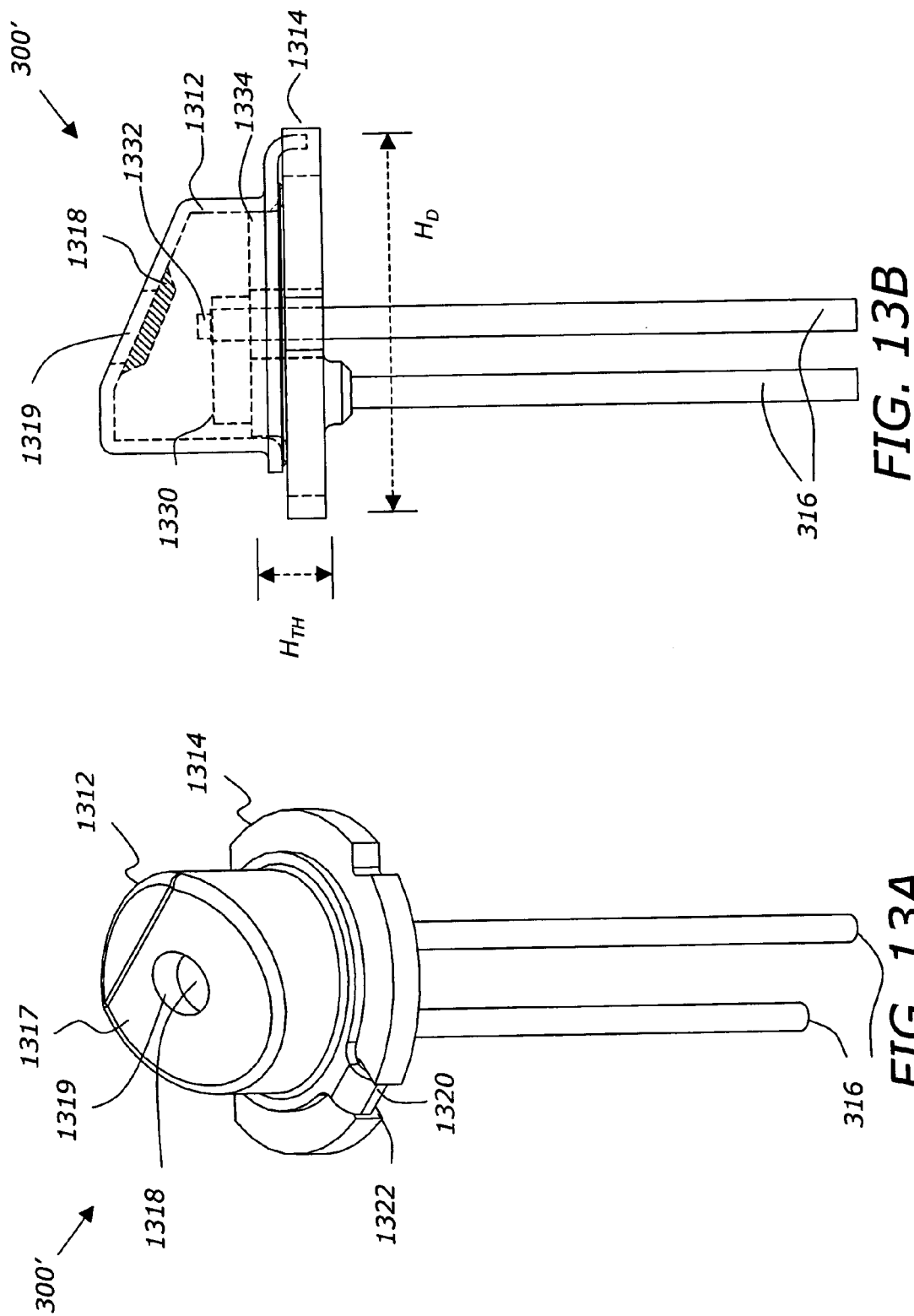

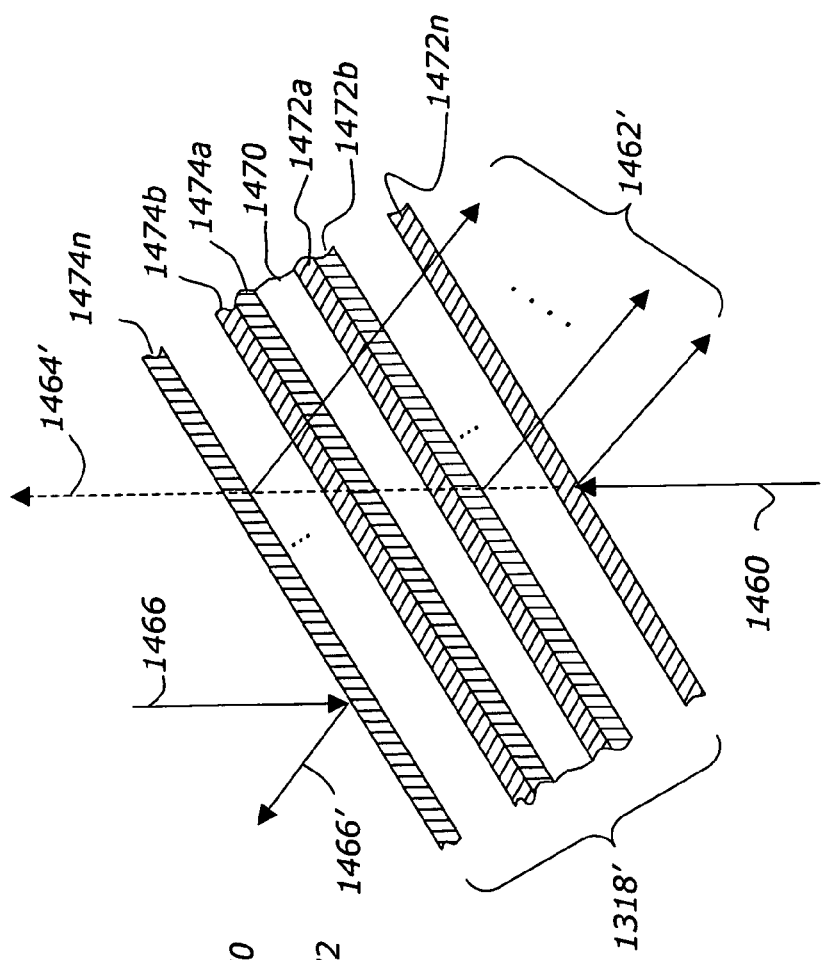
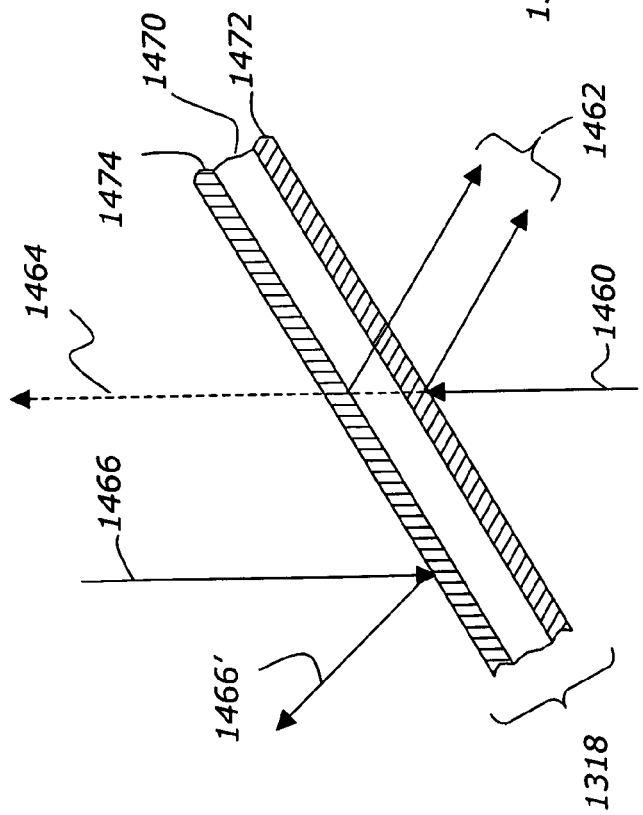
FIG. 14C
FIG. 14B

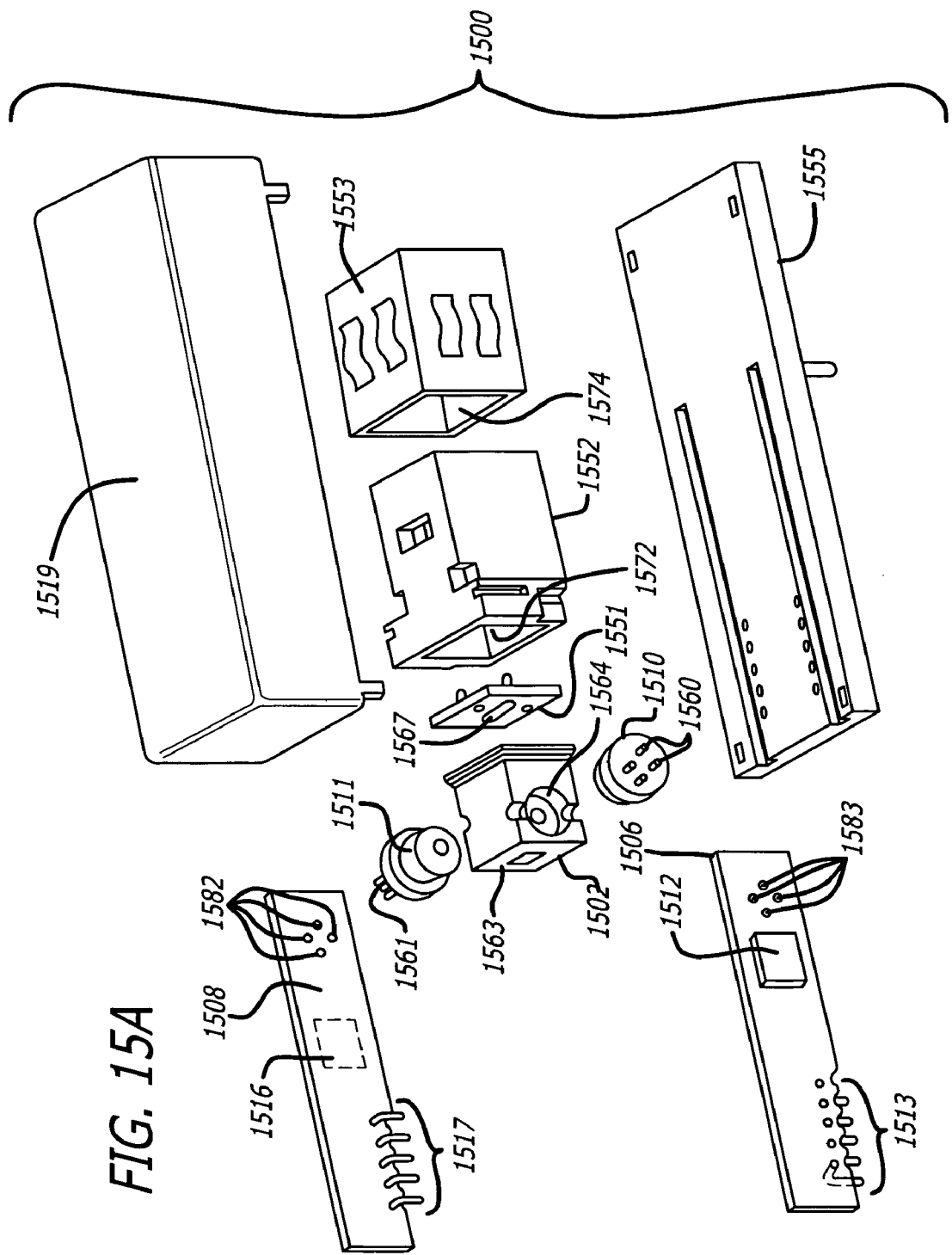

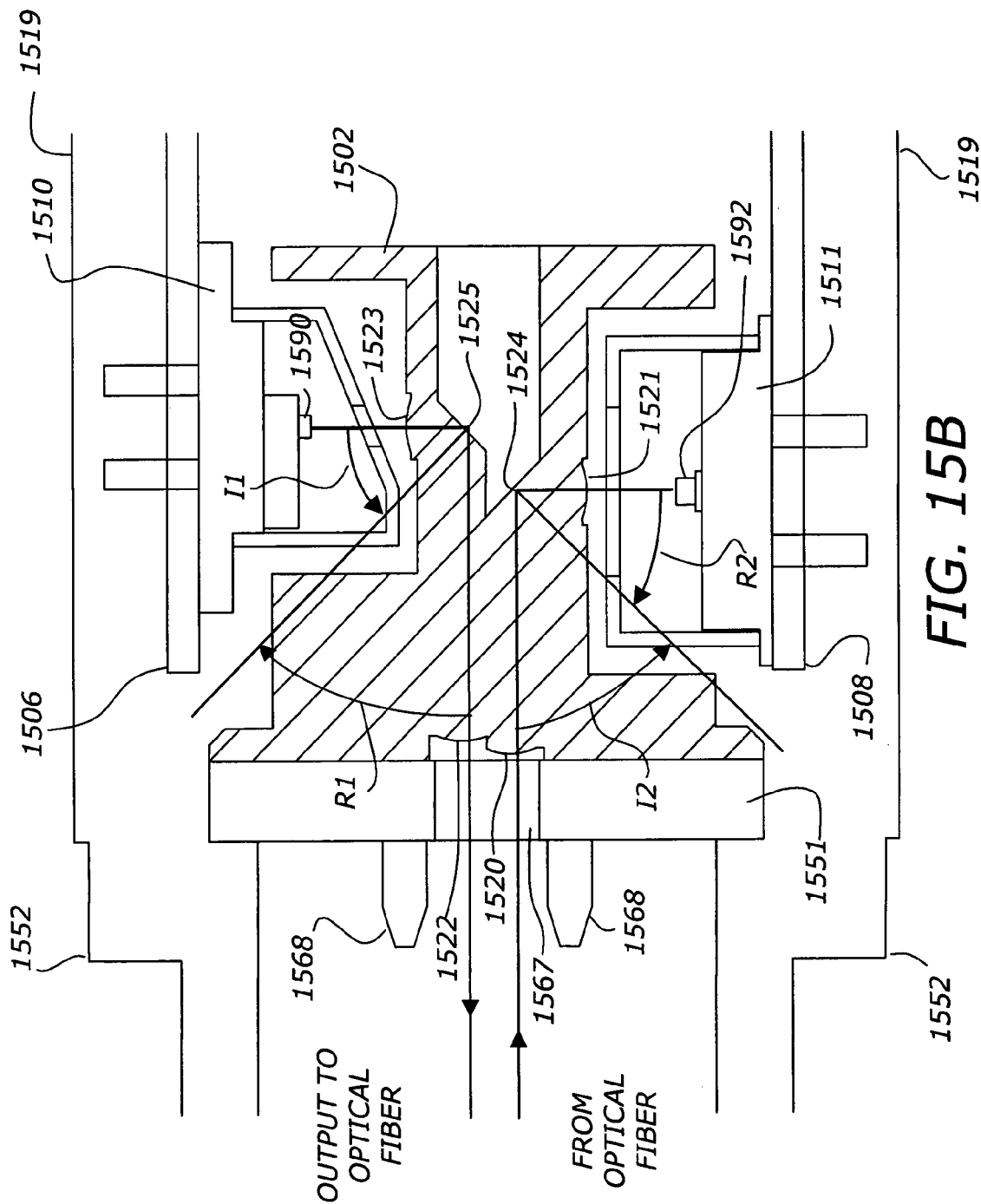

ered pin spacing of FIG. 11A.
METHODS, APPARATUS, AND SYSTEMS WITH SEMICONDUCTOR LASER PACKAGING FOR HIGH MODULATION BANDWIDTH

CROSS REFERENCE TO RELATED APPLICATION

This U.S. Non-Provisional Patent Application claims the benefit of U.S. Provisional Patent Application No. 60/403,998 entitled "SEMICONDUCTOR LASER PACKAGING FOR HIGH MODULATION BANDWIDTH", filed Aug. 16, 2002 by Michael Zhou et al.

FIELD OF THE INVENTION

The invention relates generally to the field of optoelectronic device packaging. Particularly, the invention relates to semiconductor laser packaging.

BRIEF DESCRIPTION OF THE DRAWINGS

The features of the invention will become apparent from the following detailed description of the invention in which:

FIG. 1 is a block diagram of a typical optical data link.

FIG. 4A is a magnified cross-sectional side view of an alternate embodiment of the packaged semiconductor laser including the impedance controlled circuit.

FIGS. 6A–6B are magnified perspective views of a pair of different bond wires to further reduce impedance.

FIGS. 7A–7C are magnified views of a dielectric feedthrough to provide a nominal input impedance at the pin.

FIG. 9 is a bottom view of the packaged semiconductor laser having standard pin spacing.

FIG. 10A is a magnified top view of a first alternate header with a first altered pin spacing for another embodiment of the packaged semiconductor laser.

FIG. 10B is a bottom view of the packaged semiconductor laser having the first altered pin spacing of FIG. 10A.

FIG. 11A is a magnified top view of a second alternate header with a second altered pin spacing and a first submount modified thereto for another embodiment of the packaged semiconductor laser.

FIG. 11B is a bottom view of the packaged semiconductor laser having the second altered pin spacing of FIG. 11A.

FIGS. 13A–13B illustrate an alternate thin outline package including an alternate header and variable dimensions related thereto.

FIGS. 14B–14C illustrate alternate embodiments of the material layers of the window of the slanted can or cap.

FIG. 15A is an exploded view of an first exemplary fiber optic module including an optical block to illustrate a higher order assembly of the packaged semiconductor laser.

FIG. 15B is a cutaway side view of the packaged semiconductor laser mechanically coupled to the optical block illustrated in FIG. 15A.

BRIEF SUMMARY OF THE INVENTION

Figure 2:
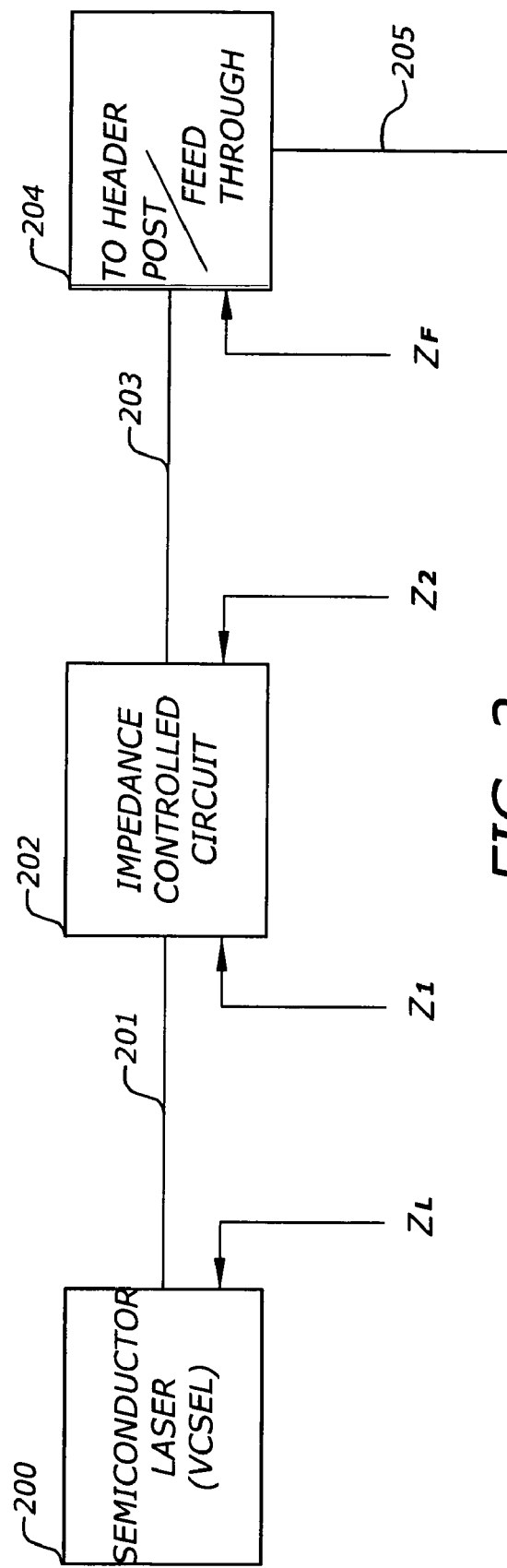
FIG. 2 is a functional block diagram illustrating the impedances around a packaged semiconductor laser including the impedance controlled circuit.

The invention is summarized by the claims that follow below.

DETAILED DESCRIPTION OF THE INVENTION

In the following detailed description of the invention, numerous specific details are set forth in order to provide a thorough understanding of the invention. However, the invention may be practiced without these specific details. In other instances well known methods, procedures, components, and circuits have not been described in detail so as not to unnecessarily obscure aspects of the invention.

In recent years there has been an increase in applications for ten gigabit per second (Gbps) optical communication systems. High-speed and low cost laser modules are in great demand. In ten Gbps applications, the semiconductor laser is typically packaged in a Mini-DIL package which is usually very expensive. The Mini-DIL package for a semiconductor laser is difficult to use in many applications where packaging size constraints, power consumption, and/or a high yield process are desirable.

In an embodiment of the invention a high-performance, yet low-cost packaging scheme for 10 gigabit per second (Gbps) vertical cavity surface emitting lasers (VCSEL) is disclosed. The semiconductor laser is packaged in a thin outline (TO) based package with added features for high-speed performance and laser power monitoring for automatic power control (APC). The packaged semiconductor laser may be incorporated into an optical transceiver or fiber optic module of an optical data link or an optical communication system.

Referring now to FIG. 1, a typical optical data link is illustrated. An optical data link includes an optical transceiver 100A, an optical transceiver 100B, and at least one fiber optic cable 102. Each of the optical transceivers 100A and 100B are bi-directional optical transceivers to interface to the at least one optical fiber 102. The elements of each optical transceivers 100A and 100B may be substantially similar. The at least one optical fiber 102 includes a first plug 104A and a second plug 104B.

The typical block functional elements of the optical transceiver 100A includes a nose or fiber optic receptacle 110, an optical block 112, optical electronics 114, transmit and receive electronics 116, and pins, terminals, pads, or connectors 118.

The nose or fiber optic receptacle 110 receives the fiber optic plug 104A of the at least one optical fiber 102. The nose mechanically couples to the optical fiber 102. The nose may have an opening to receive various types of fiber optic plugs including simplex and duplex type plugs. The fiber optical receptacle 110 holds the plug 104A in alignment with the optical block.

The optical transceiver 100A may couple to a host system 106. In order to do so the host system 106 may include poles, terminals, pads, or connectors 120 to couple to the pins, terminals, pads, or connectors 118 respectfully of the optical transceivers 10A. The pins, terminals, pads, or connectors 118 of the optical transceiver 100A is for coupling to the host system 106.

The optical block 112 is for coupling light between the optical electronics 114 and the optical fiber 102. The optical block 112 may include one or more lenses or light bending elements to couple light between the optical fiber 102 and the packaged optoelectronic components 114.

The packaged optoelectronic components 114 may transduce between electrical signals and optical signals. The packaged optoelectronic components 114 may include a packaged semiconductor laser, a packaged semiconductor detector, or both.

The transmit and receive electronics 116 appropriately controls the packaged optoelectronic components 114 to generate lights signals or receive light signals as well as electrical signals at the pins, terminals, pads, or connectors 118.

In packaging a semiconductor laser, a thin outline (TO) based package has been used for two and one half Gbps or lower data-rate lasers in the various telecommunication and data-communication applications in the past few years. Typically, a VCSEL die is mounted in the center of the TO header, with its electrical connection directly on a header's posts. The length of the wire bond in this case typically ranges from one and one-half millimeters (mm) to two and one-half mm or longer. This results in a critical electrical path which is long, and therefore has a relatively large inductance. A VCSEL packaged in this manner may typically have a modulation bandwidth of about two to four gigaHertz (GHz). In some cases, five to seven GHz may be achieved, depending on the arrangement of the wire bonding. However, the current TO structure and wire bonding scheme limits performance below ten Gbps performance.

In order to improve performance to ten Gbps, the packaged semiconductor device can include an impedance-controlled circuit is combined with the design and selection of the dimensions and materials of the package along with the position and electrical connections to provide impedance matching in a number of embodiments. In other embodiments the dimensions and materials of the package may be designed and selected to provide impedance matching along with the positioning and electrical connections made to the optoelectronic device in the package without the impedance controlled circuit.

Referring now to FIG. 2, a block diagram of an application of the impedance controlled circuit 202 is illustrated.

The impedance-controlled circuit 202 is coupled between the semiconductor laser 200 (such as a VCSEL) and the TO-header post 204. The impedance-controlled circuit 202 functions to reduce impedance in the ordinary interconnect to the semiconductor laser when a standard package is used. The Minimized interconnections 201 and 203 between impedance-controlled circuit 202 and the semiconductor laser 200 and TO header post 204 are formed respectively with reduced impedances.

To avoid transmission line reflections, the impedances $Z_1$ and $Z_2$ of impedance controlled circuit 202 are impedance matched to the impedance $Z_L$ of semiconductor laser 200 and the feedthrough impedance $Z_F$ as seen at the TO header post 204 or pin 205, respectively. In a preferred embodiment, the impedances $Z_1$ and $Z_2$ of the impedance controlled circuit 202 are equal to each other and to the impedance $Z_L$ Of semiconductor laser 200 and the feedthrough impedance $Z_F$. For example, a nominal impedance for the semiconductor laser 200 at a given frequency or frequency range is fifty ohms. The design of the TO package is slightly adjusted so that the nominal feedthrough impedance $Z_F$ matches the nominal impedance of the semiconductor laser 200. Thus in the example, $Z_F$ is also fifty ohms at the given frequency or frequency range. The design of the impedance controlled circuit 202 provides nominal impedances for $Z_1$ and $Z_2$ which are the same to match that of the semiconductor laser 200. Thus in the example, $Z_1$ and $Z_2$ which are equal are also fifty ohms at the given frequency or frequency range.

In other embodiments, the impedance-controlled circuit 202 may additionally be used to compensates for what otherwise might be a slight mismatch between the impedances of the TO-header post and the semiconductor laser including the interconnect there-between and the pin 205. In which case, $Z_1$ and $Z_2$ may be unequal or equal at the nominal frequency, but provide compensation at other frequencies. The impedance-controlled circuit 202 may compensate for resistance, inductance, and capacitance.

Figure 3B:
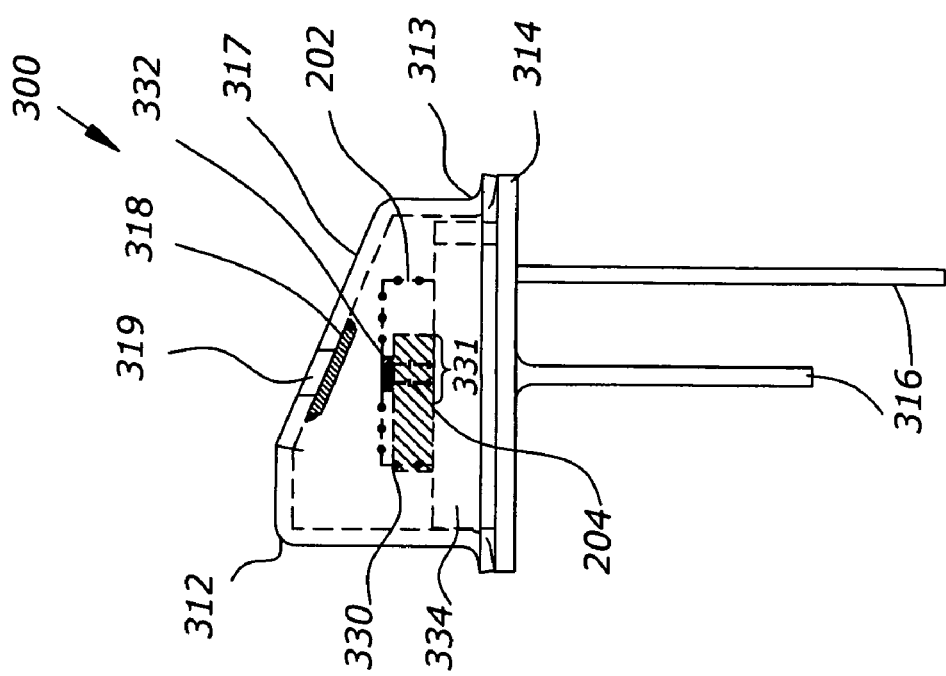
FIGS. 3A–3D are magnified views of an embodiment of a packaged semiconductor laser including the impedance controlled circuit.
Figure 3A:
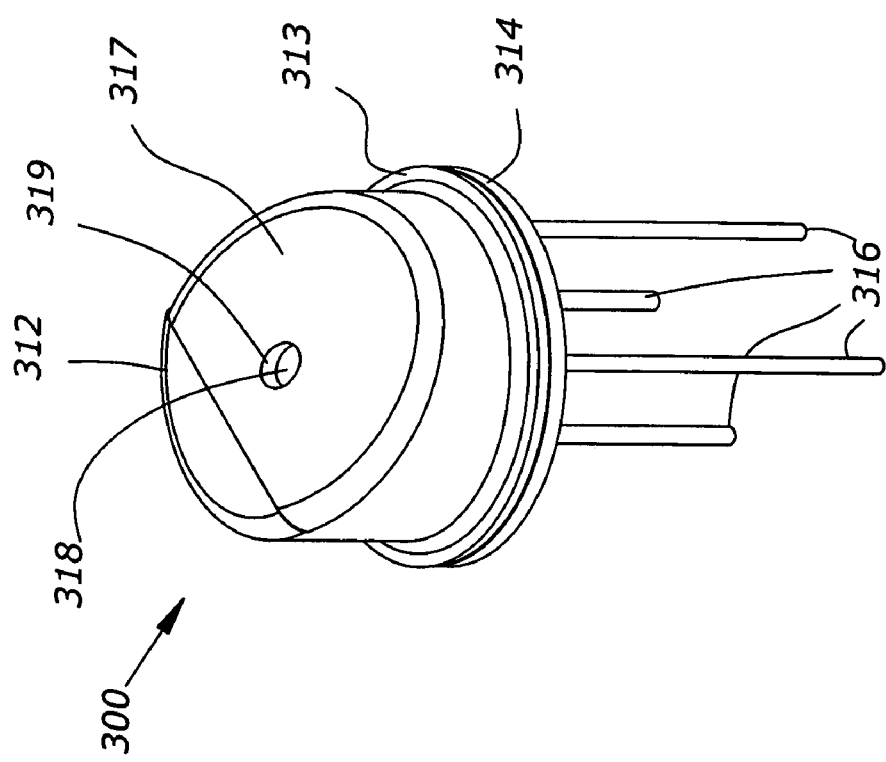

Referring now to FIG. 3A, a perspective view of a packaged semiconductor laser 300 is illustrated. The packaged semiconductor laser may also be referred to herein as a packaged transmitter because they are used in communication systems to transmit data signals using light signals.

The packaged semiconductor laser 300 includes a slanted window can or cap 312, a header 314, and pins or leads 316 of a device package. In a preferred embodiment, the device package is a thin outline (TO) type of device package and the slanted window can or cap 312 is a slanted window TO can or cap and the header 314 is a TO header. The header 314 generally provides mechanical support and electrical connections to one or more pins. The slanted window can or cap 312 generally provides a hermetic seal to the header 314 to enclose a device, allows a portion of laser light to pass out through a window and from the package, and reflects a portion of the laser light back to a photodetector 330 for power monitoring and automatic power control of the semiconductor laser. That is, the window of the slanted window can is partially transparent and partially reflective to the laser beam emitted from the semiconductor laser. The reflected light on the photodetector generates a monitor current for control of the output power from the semiconductor laser.

The slanted window can 312 includes a lip 313, a slant lid or angled top 317, a glass window 318, and a window opening 319 as shown and illustrated. The lip 313 of the slanted window can 312 is for sealing to a surface of the header 314. The glass window 318 allows a portion of the laser beam to pass through it. The window opening 319 allows the portion of the laser beam to exit out from the package 300 into space or into a fiber optic cable or other optical transmission media. The slanted window can 312 may further include a can tab that mates with a slot in the header 314 for proper alignment of the slant lid 317 and the slant window can 312 with the header 314. A can tab and slot are described below and illustrated in other Figures herein.

Referring now to FIG. 3B, a cut away side view of the packaged semiconductor laser 300 is illustrated. The glass window 318 is hermetically sealed to the inside surface of the slanted window can 312. More particularly, the glass window 318 is hermetically sealed to the inside surface of the slant lid 317 of the slanted window can 312. The glass window 318 may have a circular shape and a diameter to cover over the window opening 319 of the slant lid 317 to seal out dust and dirt. The hermetic seal between the glass window 318 and the slanted window can 312 further prevents moisture from seeping inside into the packaged semiconductor laser.

Inside the packaged semiconductor laser 300 is a semiconductor photodiode or photodetector 330, a semiconductor laser 332 such as a vertical cavity surface emitting laser (VCSEL), and the impedance controlled circuit 202. In a preferred embodiment, the photodiode is a PIN type of photodiode. The photodiode 330 and the impedance controlled circuit 202 are attached to a surface of a header flange 334 of the header 314. The impedance controlled circuit 202 couples to a header post 204 of one of the pins 316 which extends above the header. The impedance controlled circuit 202 further couples to the semiconductor laser 332.

Figure 3C:
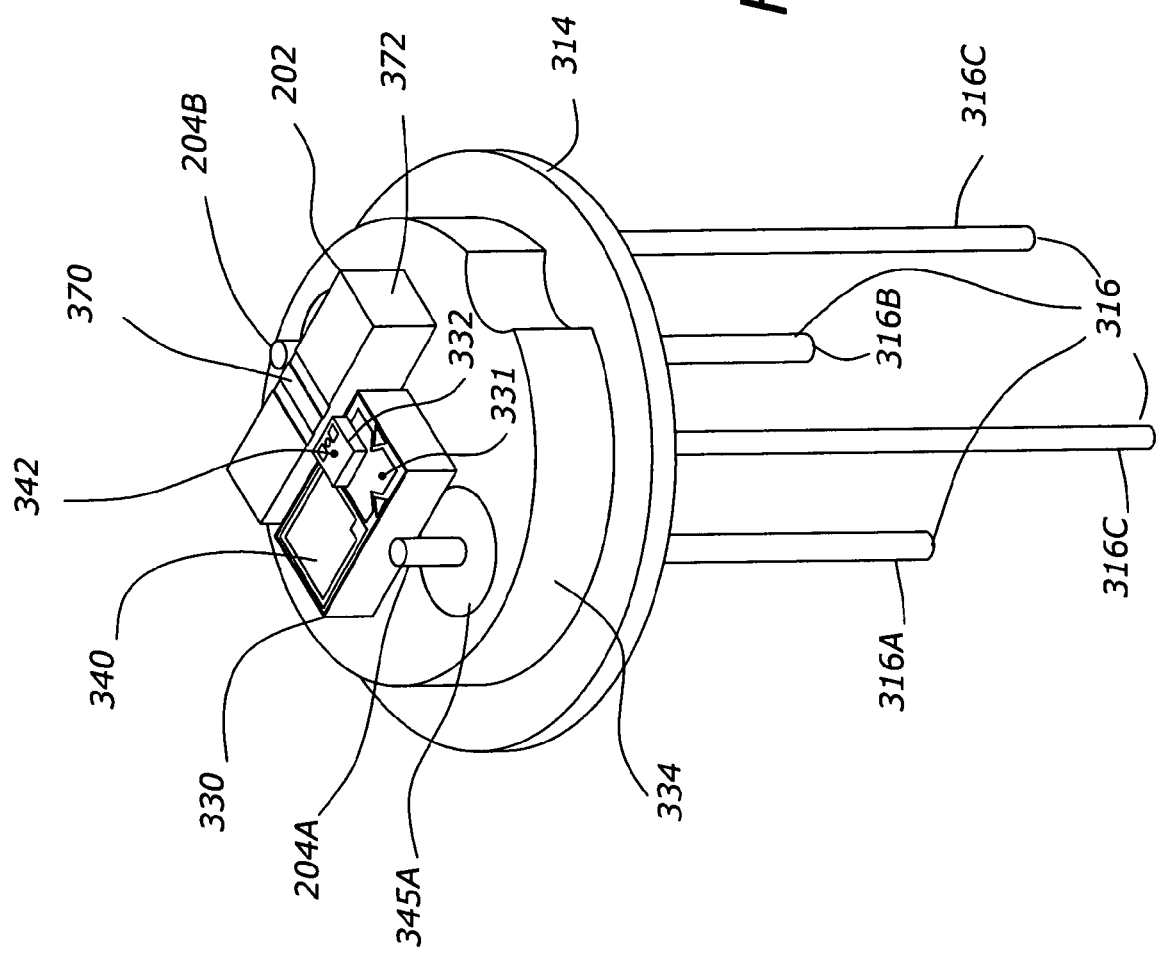
Figure 3D:
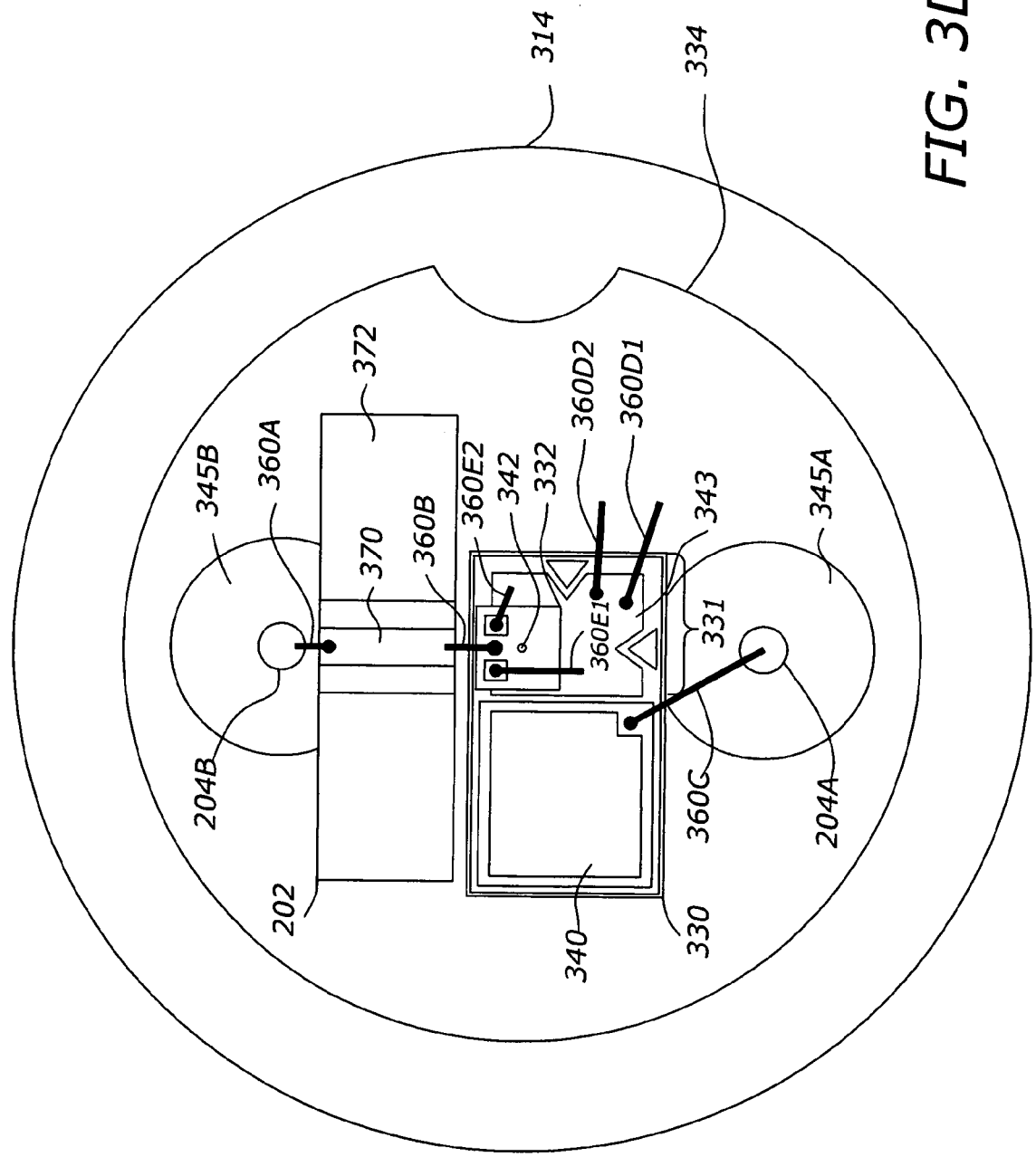

The photodiode 330 has a submount portion 331 (better illustrated in FIGS. 3C and 3D). The semiconductor laser 332 is attached to a top surface of the submount portion 331 of the photodiode 330. The submount portion 331 of the photodiode 330 may include vias to electrically couple between the header flange 334 and a substrate surface of the VCSEL 332. In another embodiment, the submount portion 331 may be a submount separate and apart from the photodiode 330.

Referring now to FIG. 3C, a perspective view of the packaged semiconductor laser 300 without the slanted window can 312 and bond wire interconnects is illustrated. As discussed previously, the semiconductor laser 332 is attached to a top surface of the submount portion 331 of the photodiode 330. The submount portion 331 of the photodetector 330 locates the semiconductor laser die 332 in position within the package in x, y and z coordinates.

To emit light or photons transduced from an electrical signal or electrons, the semiconductor laser 332 includes a surface emitting area 342 and an active region (not shown) formed of one or more quantum well structures.

For transducing light or photons into an electrical signal or electrons, the photodiode 330 includes a light detection area 340 opposite the submount portion 331. The light detecting area 340 (acting as a photodetector) is a monitoring photodetector to detect and monitor the output power of the semiconductor laser 332.

FIG. 3D is a magnified top view of an embodiment of the packaged semiconductor laser 300 without the slanted window can 312 assembled thereto. In FIG. 3D, bond wire interconnects (generally referred to as 360) or bond wires are illustrated forming electrical connections between elements of the packaged semiconductor laser 300.

Referring now to FIGS. 3C and 3D, the impedance-controlled circuit 202 is located between the semiconductor laser 332 and the TO-header post 204B. The impedance-controlled circuit 202 includes at least one impedance-control line 370 fabricated on top of a printed circuit board 372.

As illustrated in FIG. 3D, one end of the at least one impedance control line 370 (i.e., a transmission line) of the impedance controlled circuit 202 will be wire-bonded to the TO-header post 204B to receive a driving current for the semiconductor laser 332 from the pin 316B. An opposite end of the at least one impedance control line 370 (i.e., a transmission line) of the impedance controlled circuit 202 will be wire-bonded to the semiconductor laser die 332 to provide the drive current thereto.

A wire bond 360A couples to the header post 204B at one end and the at least one impedance control line 370 at an opposite end. A wire bond 360B couples to a bonding pad of the semiconductor laser 332 at one end and the at least one impedance control line 370 at an opposite end. A wire bond 360C couples to a bonding pad of the semiconductor photodetector 330 at one end and the header post 204A at an opposite end.

In one embodiment, the submount 331 may include a large bonding pad 343 to which multiple wire bonds may be coupled. In FIG. 3D, wire bonds 360D1 and 360D2 couple to the header flange 334 at one end and the bonding pad 343 at an opposite end. Wire bonds 360E1 and 360E2 couple to a pair of pads of the semiconductor laser 332 at one end and the bonding pad 343 at an opposite end. The header flange 334 is coupled to at least one of the pins 316. Typically the header flange is grounded to a source of ground or a low level voltage supply.

Each of the wire bonds 360 has an impedance associated with it. Typically the impedance of a bond wire is mostly inductance. The resistance in the bond wires are usually negligible but for the case of high currents. The shorter the length of the bond wire the less inductance and resistance there is in the bond wire. The larger the diameter of the bond wire, the less inductance and resistance there is associated with it. Coupling two bond wires in parallel together, such as bond wires 360D1 and 360D2 for example, lower the resistance and inductance of the overall connection between two points because the resistance and inductance of each are placed in parallel.

As illustrated in FIGS. 3C and 3D, the positioning of the semiconductor laser 332, the impedance controlled circuit 202, and the header post 204B are such to minimize the lengths of the bond wires 360A and 360B and their associated impedances with respect to the at least one control line 370. The impedance controlled circuit 202 is die attached onto a top surface of the header flange 334 relatively close to the header post 204B to minimize the length of bond wire 360A. The submount 331 (i.e. photodetector 330 including submount portion 331) is die attached onto a top surface of the header flange 334 relatively close to the impedance controlled circuit 202 and the semiconductor die 332 is die-attached onto a top surface of the submount 331 and located next to an edge thereof closest to the impedance controlled circuit 202 to minimize the length of bond wire 360A.

The heights relative to the header flange 334 of the top surface of the semiconductor laser 332 and the top surface of the at least one control line 370 to which wire bond 360B is formed is substantially equal to further minimize the length of the bond wire 360B. The heights relative to the header flange 334 of the top surface of the header post 204B and the top surface of the at least one control line 370 to which wire bond 360A is formed is substantially equal to further minimize the length of the bond wire 360A.

In other words, one contact point of the at least one control line 370 is made as close as possible to the header post 204B and another contact point of the at least one control line 370 is made as close as possible to a wire bond pad on the semiconductor laser 332. Generally, the elements are placed so that the at least one impedance control line 370 is made as close as possible to the header post 204B and the semiconductor laser 332 so that the bond wires are kept as short as possible.

To further reduce inductance in the bond wires, a thicker bond wire can be used as the bond wires 360 as is discussed further below. Furthermore, extra wire bonding may be used to reduce inductance when added in parallel and in the case larger currents are expected. For example, extra bond wires 360D1 and 360D2 are used to couple the contact 331 to the header flange 334 and couple large currents to ground. In these cases, the length of the wire bonding is greatly reduced to minimize inductance introduced by the bond wire without any impedance matching provided by the impedance control circuit 202.

Referring now to FIG. 4A, a magnified cross sectional right side view of an another embodiment is illustrated. FIG. 4A illustrates a submount 331', a semiconductor laser 332', and the impedance controlled circuit. In order to further reduce inductive coupling to the semiconductor laser, the submount 331' has one or more vias 402 to electrically connect a top large bonding pad or surface contact area 343' to a bottom surface contact area 406 of the submount. The bottom surface contact area 406 is die attached to the header flange 334 using a conductive epoxy to mechanically and electrically couple the bottom surface contact area 406 to a top surface of the header flange 334. The impedance controlled circuit 202 includes a ground plane 470 which is also die attached to the header flange 334 using a conductive epoxy to mechanically and electrically couple thereto.

A bottom surface of the semiconductor laser 332' in this case has bottom contacts 414. The bottom contacts 414 of the semiconductor laser 332' couple to the surface contact area 343' of the submount 331 and electrically connect through the vias 402 to the header flange 334. Optional vias 412 in the semiconductor laser 332' may be used to route an upper connection to the bottom contacts 414 in order to make such a connection. This embodiment eliminates the wire bonds 360D1, 360D2, 360E1 and 360E2 illustrated in FIG. 3D to further reduce inductance in the connections to the semiconductor laser 332.

FIG. 4A also illustrates how the submounts described herein elevate and mechanically support the semiconductor laser die above the header flange at a level near the top of the header posts. Thus being at the same height, wire bonds may be made between the semiconductor laser die and the top of the header posts with minimal lengths.

Figure 4B:
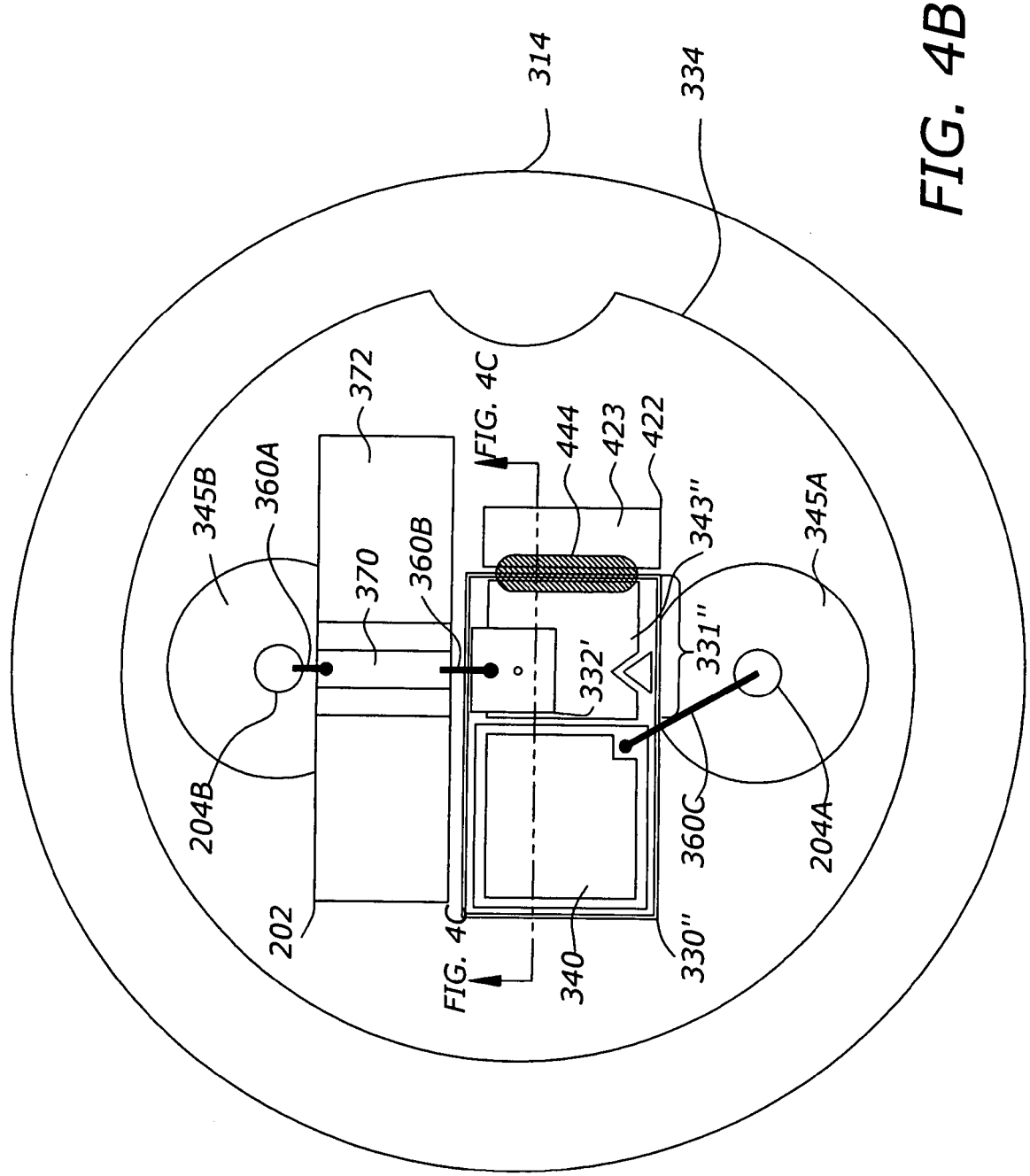
FIGS. 4B–4C are magnified views of another alternate embodiment of the packaged semiconductor laser including the impedance controlled circuit.

Referring now to FIG. 4B, a magnified top view of yet another embodiment for the packaged semiconductor laser is illustrated. FIG. 4B illustrates a top view of a submount 331" of a photodetector 330", the semiconductor laser 332', the impedance controlled circuit 202 and a conductive block 422.

The wire bonds 360E1 and 360E2 illustrated in FIG. 3D have been eliminated by using the optional vias 412 in the semiconductor laser 332'. The bottom contact 414 of the semiconductor laser 332' couples to the large bonding pad or surface contact 343" of the submount 331".

The wire bonds 360D1, and 360D2 illustrated in FIG. 3D have been eliminated by conductively epoxying a top surface of the conductive block 422 to the surface contact 343" of the submount 331" and a bottom surface of the conductive block 422 to the header flange 334.

The conductive block 422 is formed out of a conductive material such as metal, an alloy, or other conductive material. The conductive block 422 may be rectangularly shaped as illustrated, cylindrically shaped, or take on another shape so that the conductive block 422 has a top surface 423 to which a conductive epoxy could adhere and form an electrical connection thereto.

A conductive epoxy 444 electrically couples the top surface 423 of the conductive block 422 to the surface contact 343". In order to do so, an edge of the surface contact 343" extends out to substantially meet an edge of the submount portion 331" of the photodetector 330" and the height of the conductive block 422 is substantially similar to the height of the submount portion 331". In other words, the conductive block 422 is approximately level with the surface contact 343". The conductive epoxy 444 electrically couples to the surface contact 343" at the extended edge of the surface contact 343".

Figure 4C:
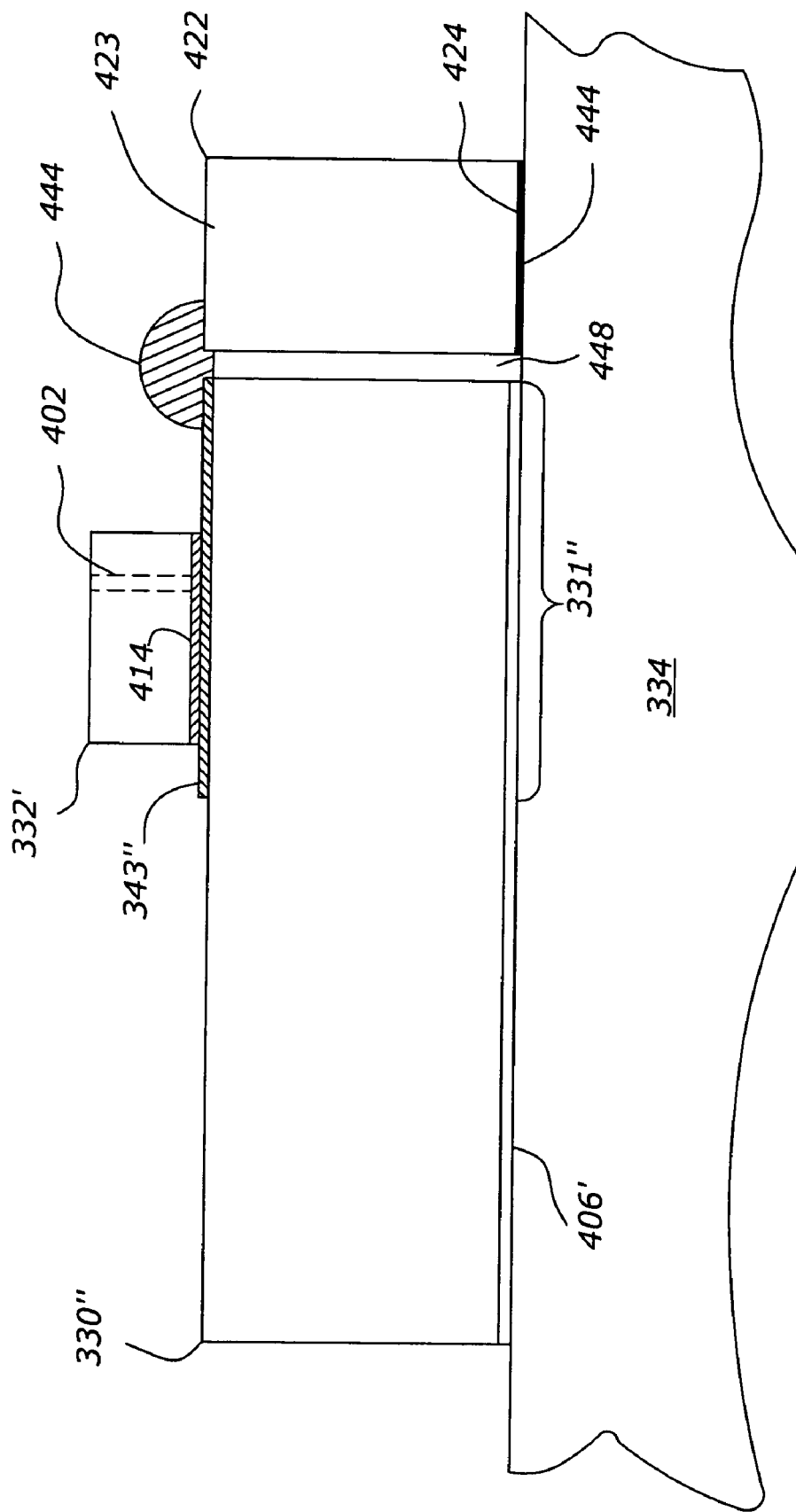

Referring now to FIG. 4C, a magnified cross-sectional front side view of the embodiment of FIG. 4B is illustrated. The photodetector 330" and the conductive block 422 are die attached to the header flange 334 as close as possible to each other leaving only a small gap 448. A bottom surface 424 of the conductive block 422 is epoxied using the conductive epoxy 444 to the header flange 334. This mechanically and electrically couples the conductive block 422 to the header flange 334. A bottom contact 406' of the photodetector 330" may also be conductively epoxied to the header flange 334.

When mounted to the header flange 334, the conductive block 422 is approximately level with the surface contact 343" of the submount portion 331" of the photodetector 330' as is illustrated. A strip of conductive epoxy 444 is poured onto both the top surface 423 of the conductive block 422 and the surface contact 343" of the submount 331" across the gap 448. The conductive epoxy effectively provides a bridge connection across the gap 448. As previously discussed, the conductive epoxy 444 electrically couples to the surface contact 343" at the extended edge of the surface contact 343". The width of the conductive epoxy 444 along the edge of the surface contact 343" may be adjusted to vary the impedance of the connection made. A wider strip of conductive epoxy further reduces the impedance of the bridge connection over the gap 448.

The semiconductor laser 332' is shown illustrated in the embodiment of FIGS. 4B–4C using a bottom connection 414 and possibly an optional via 402 if necessary. However, the semiconductor laser 312 with top bonding pads and bond wires 360E1 and 360E2 as illustrated in FIG. 3D may be used to couple the laser to the surface contact 343".

Figure 5A:
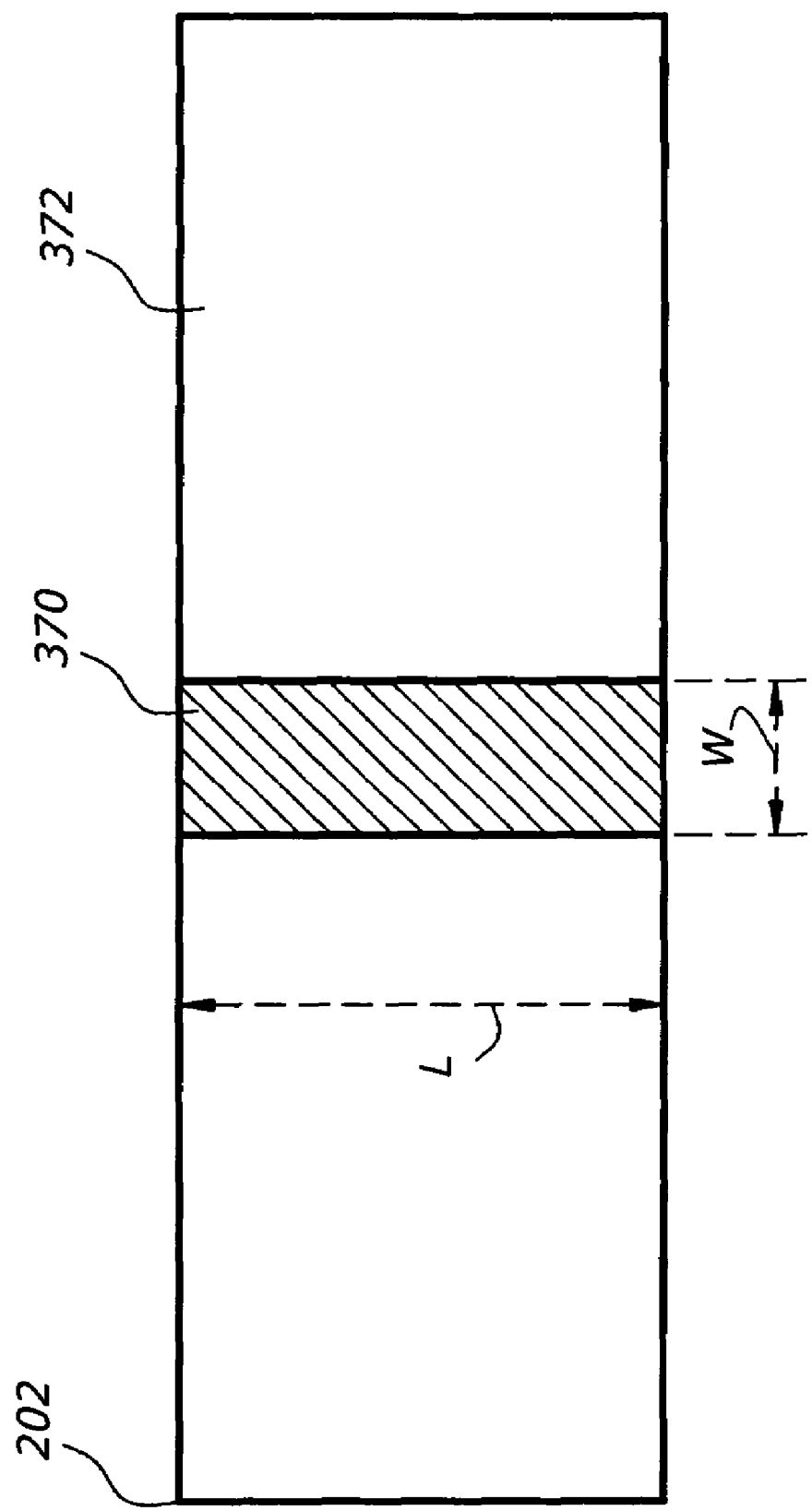
FIGS. 5A–5B are magnified views of the impedance controlled circuit.
Figure 5B:
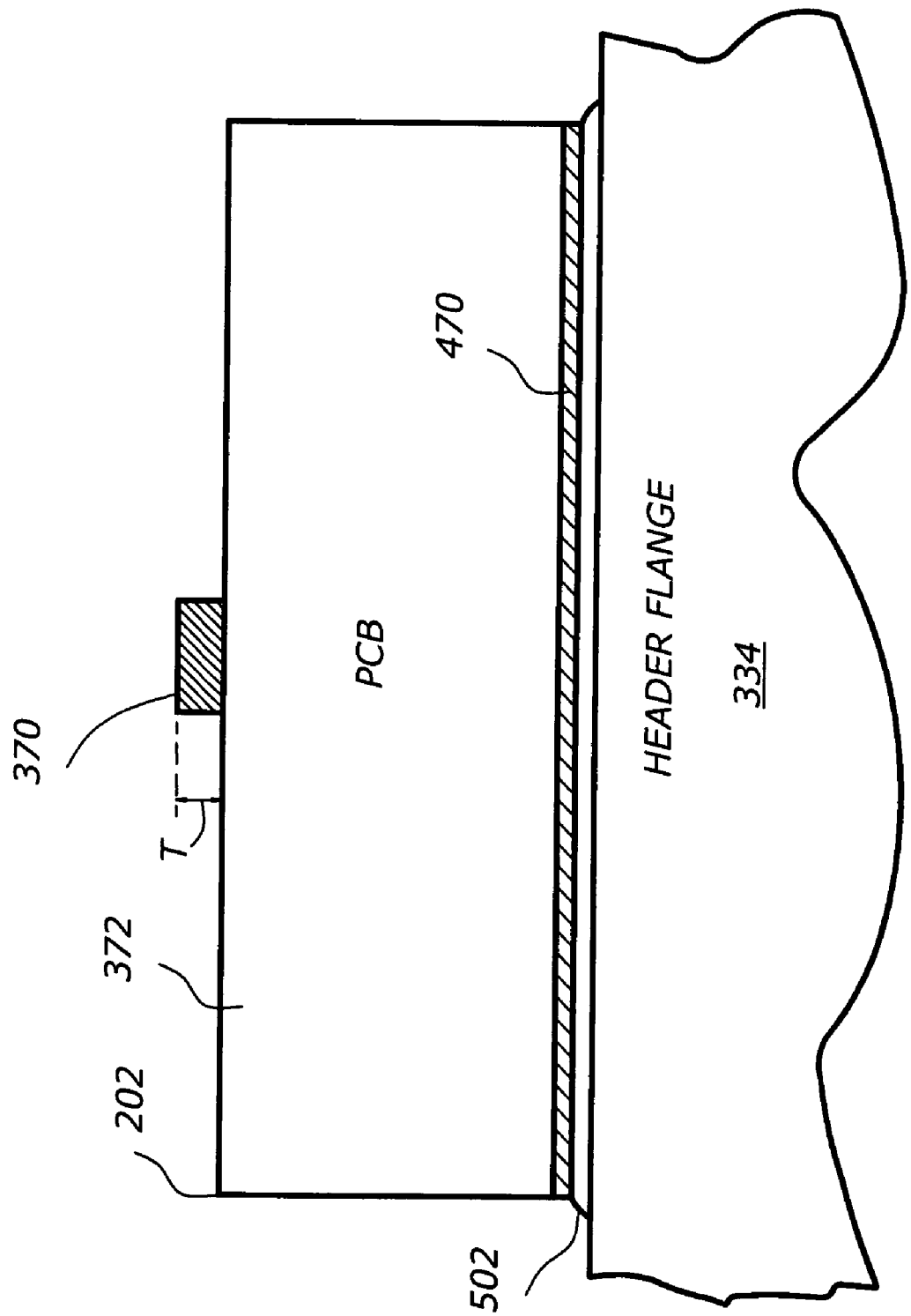

Referring now to FIGS. 5A and 5B, magnified views of the impedance controlled circuit 202 are illustrated. FIG. 5A illustrates a top magnified view of the impedance-controlled circuit 202. FIG. 5B illustrates a side magnified view of the impedance controlled circuit 202. As discussed previously, the at least one impedance control line 370 is formed on a top surface of the printed circuit board 372. The printed circuit board 372 of the impedance-controlled circuit 202 includes a ground plane 470 having a surface which is die attached by a conductive epoxy 502 to a top surface of the header flange 334. The header flange 334 electrically couples to the ground plane 470. The printed circuit board 372 is a dielectric and depending upon its selection may have different dielectric constants. The ground plane is for the at least one impedance-control line 370.

The at least one impedance control line 370 may be formed using microstrip line or transmission line techniques. In either case, the impedance control line 370 is a wave guide to the signal that propagates across it. The impedance control line 370 may include circuit element equivalents formed using microstrip line techniques or transmission line techniques. The at least one impedance control line 370 may generally be considered to have a length L, a width W, and a thickness T. Variations in width, length, and thickness of the least one control line 370 may occur from one end to another in order to achieve a desired impedance effect. Additionally, a plurality of impedance control lines 370 may be coupled together in different ways to achieve desired impedances in the impedance controlled circuit 202. Furthermore, other discreet components may be coupled to the printed circuit board 373 to provide impedance compensation. The discreet components may be chip resistors, chip capacitors, or chip inductors.

The printed circuit board 372 may be a laminate of material layers of a standard laminate grade (e.g., Rogers FR-xx, G-xx, and GPO-xx) or a solid material such as ceramic. Pairs of the material layers for the printed circuit board 372 may be paper/phenolic, paper/epoxy, glass/epoxy, glass/phenolic, glass/melamine, glass/polyester, and teflon fiberglass. The material layers establish an associated dielectric constant for the printed circuit board and a thickness which effects the impedance of the at least one impedance control line 370.

The at least one impedance control line 370 is formed of a conductive material, such as a metal, and has dimensions of a length, a width, and a thickness. These dimensions may also be a factor in the impedance of the at least one impedance control line 370. The type of conductive material may also be a factor in the impedance of the at least one impedance control line 370. The conductive material may be a metal such as gold, copper, silver, titanium, and aluminum, an alloy thereof, or another conductive element such as silicon, germanium, or carbon. The signal wavelength in free space (i.e.,) which is a function of the signal frequency is also a factor to consider in designing the impedance of the at least one impedance control line 370. The length dimension of the at least one impedance control line 370 is often proportional to a fraction of the wavelength of the signal in free space.

The impedance controlled circuit 202 provides a nominal impedance at a given frequency or over an average frequency range. For example, the nominal impedance of the impedance control circuit 202 is fifty ohms at ten gigahertz (i.e., ten Gbps) in a preferred embodiment. It is desirable that the nominal impedance of the impedance controlled circuit 202; the feedthrough 345B and/or feedthroughs 345A–345B; and the semiconductor laser 332 match.

Figure 6B:
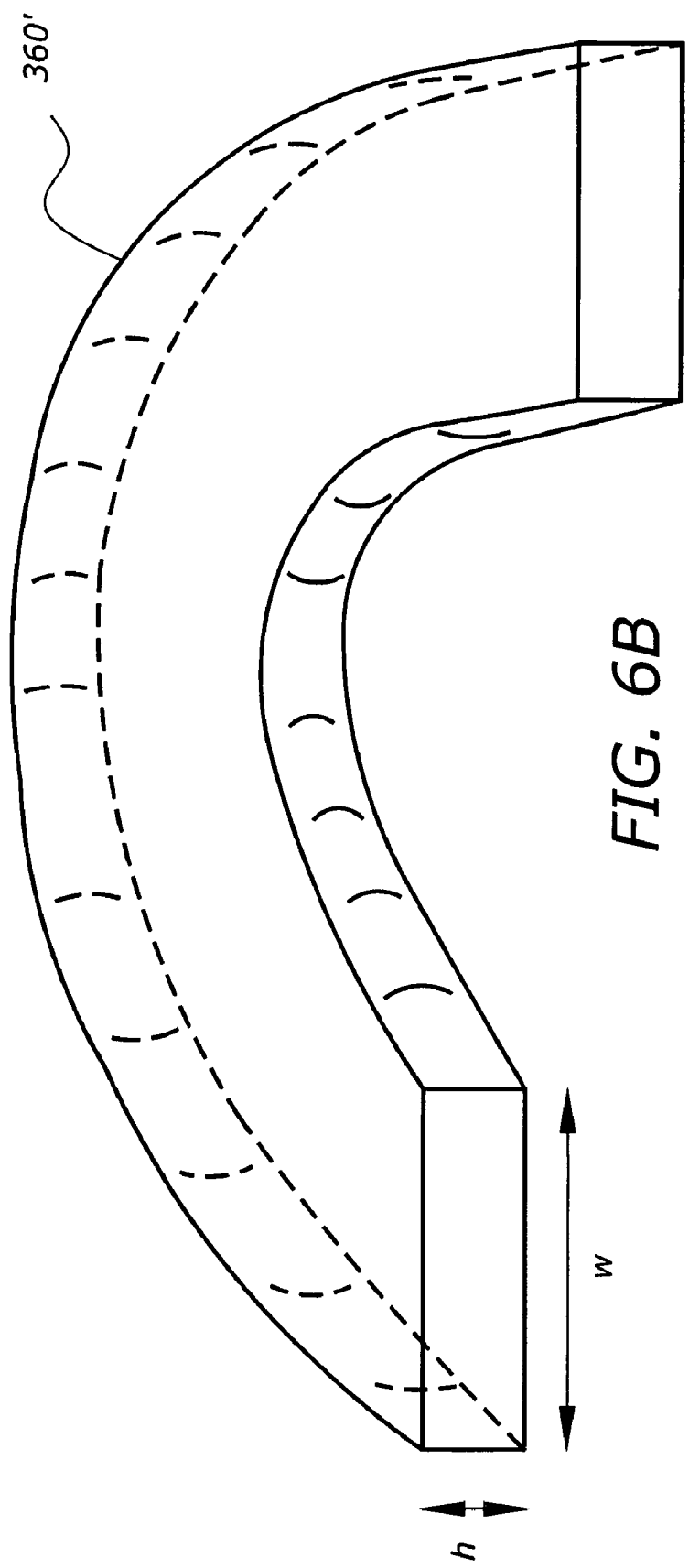

Referring now to FIGS. 6A and 6B, perspective views of different types of bond wires are illustrated. In FIG. 6A, a standard circular cylindrical bond wire 360 is illustrated. The diameter of the circular cross section of the bond wire 360 is d. The diameter d is typically twenty-five microns wide. The inductance and impedance of the bond wire 360 may be reduced by using a larger diameter bond wire where d is greater than thirty microns for example. The diameter d may be from thirty to one hundred fifty microns or more for example to reduce the induction and impedance therein. To accommodate the larger diameter bond wire 360, the dimensions of the bonding pads of the devices may need to be increased accordingly.

Reduction in impedance in the bond wires may also be obtained by using a "ribbon bond wire" 360'. The ribbon bind wire 360' is a rectangular cylindrical bond wire. The rectangular cross section of the ribbon bond wire 360' has dimensions of a height h and a width w. The width w of the ribbon bond wire 360' is significantly greater than the height h in order to reduce the inductance and impedance of the bond wire. Assume for example that the height h may be the same as the standard diameter of the circular bond wire, twenty-five microns. The width w of the ribbon bond wire 360' is significantly greater than the height h, such as a multiple or four or five times the dimension of the height h for example. In the case that the height is twenty five microns, the width w of the ribbon bond wire 360' may be on the order of one-hundred to one-hundred-twenty-five microns. To accommodate the larger dimensions of the ribbon bond wire 360', the dimensions of the bonding pads of the devices may need to be increased accordingly. In which case, the ribbon bond wire 360' may replace one or more of the bond wires 360 illustrated in the Figures (e.g., bond wires 360A–360E2 illustrated in FIG. 3D).

Figure 7C:
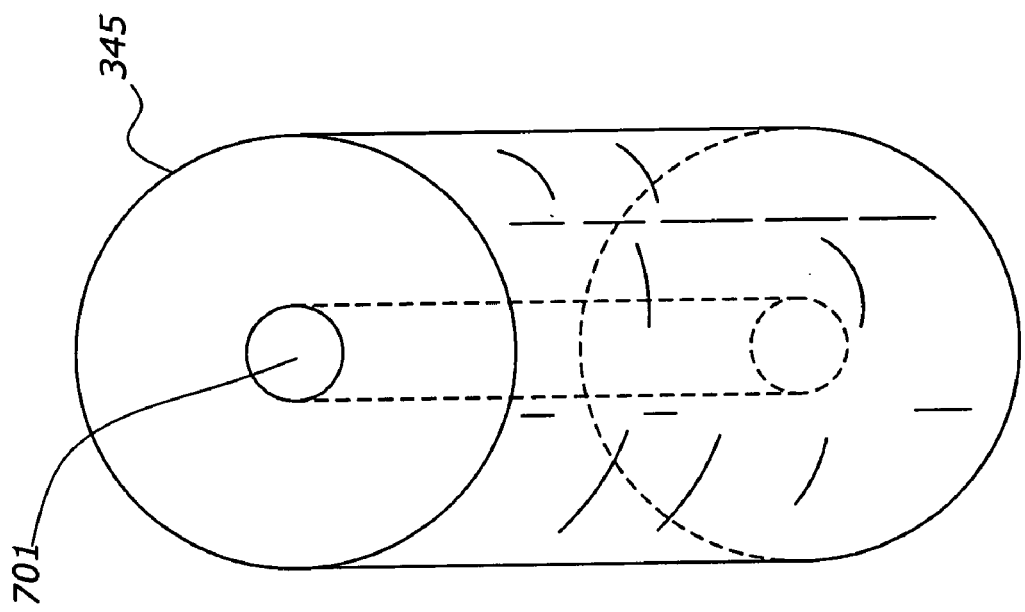
Figure 7B:
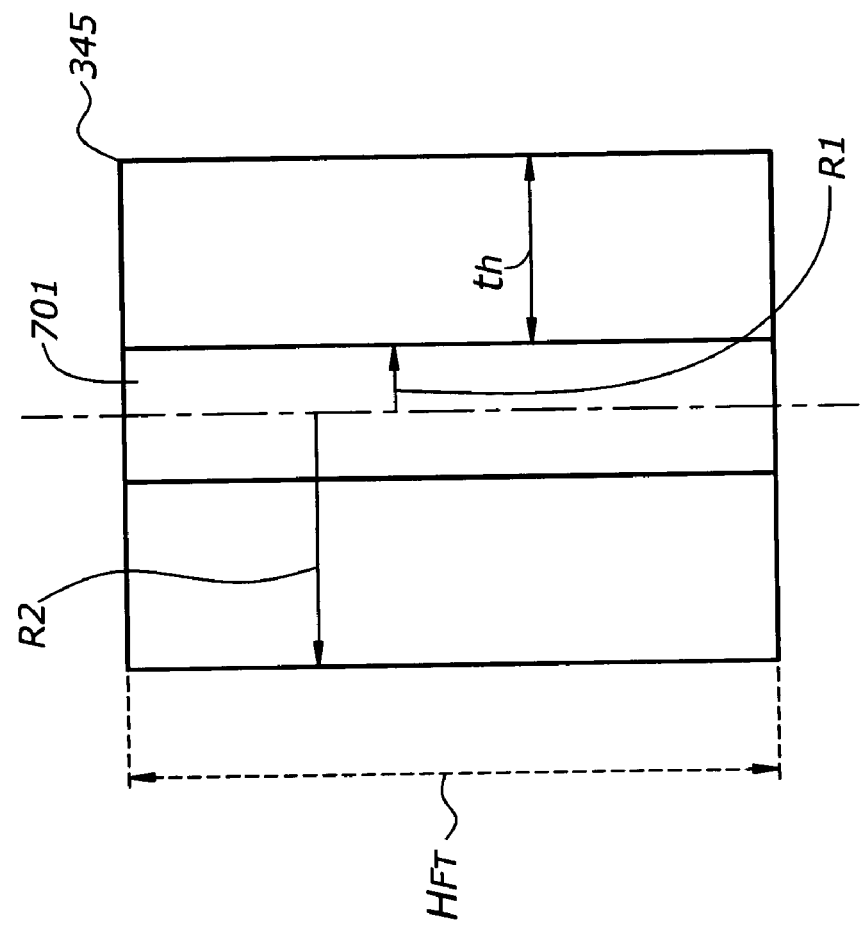

Referring now to FIGS. 7A–7C magnified views of a feedthrough 345 used for at least feedthrough 345B are illustrated. Feedthrough 345 referred to herein generally represents feedthroughs 345A and 345B. Feedthrough 345 as illustrated in a magnified top view of FIG. 7A is shaped similar to a hollow circular cylinder with a thickness th. The feedthrough 345 has a radius R1 which is in the inner radius of the hollow cylinder and a radius R2 which is the outer radius of the hollow cylinder. The thickness of the feedthrough 345 is the difference between R2 and R1 which is given by the equation of th=R2−R1.

The empty solid cylinder 701 of radius R1 is where a portion of the pin 316 would otherwise fill. The radius R1 may be considered to be substantially equal to the radius of the pin. The radius R2 conforms to a solid cylinder that fills a cylindrical opening in the header 314.

Referring now to FIG. 7B, a magnified cross-sectional view, the feedthrough 345 has a height $H_{FT}$ which corresponds to the depth of a cylindrical opening in the header 314 and header flange 334. The depth of the cylindrical opening is the equivalent of the thickness of the header 314 and the header flange 334. Thus the height $H_{FT}$ of the feedthrough 345 may be altered by varying the thicknesses of the header 314 and the header flange 334 in order to provide a desired nominal feedthrough impedance value $Z_F$. In this manner, the feedthrough impedance value $Z_F$ of one or more pins of the TO-header can be designed according to the impedance of the semiconductor laser 332. It is desirable that the nominal impedance of the feedthrough 345B match the nominal impedance of the semiconductor laser 332.

FIG. 7C illustrates a magnified perspective view of the feedthrough 345 which better illustrates its shape being described as a hollow circular cylinder.

Figure 8B:
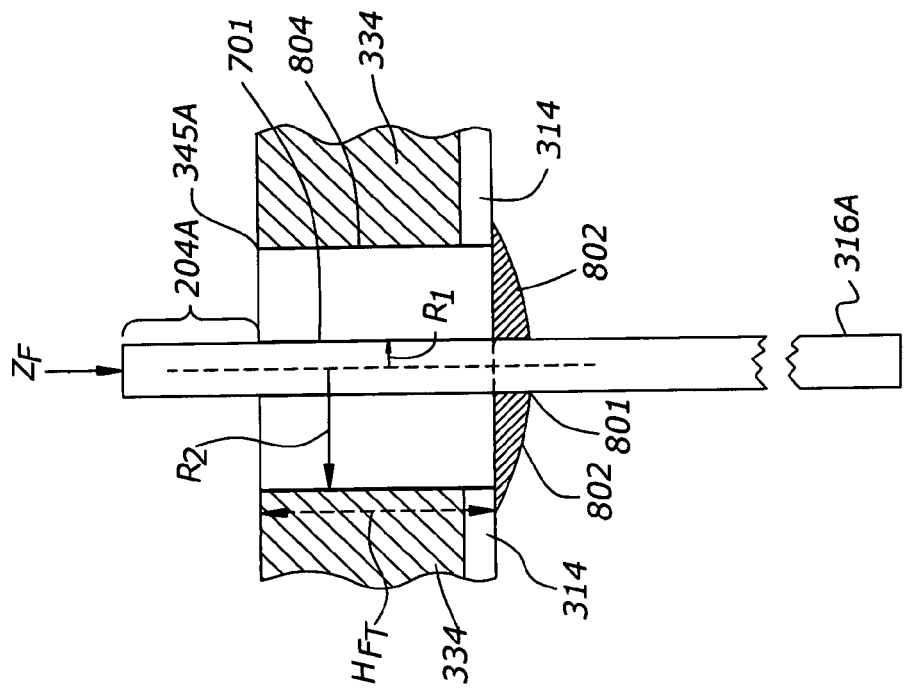
FIG. 8B is a magnified cross-sectional side view of an assembled pin and feedthrough in the header.
Figure 8A:
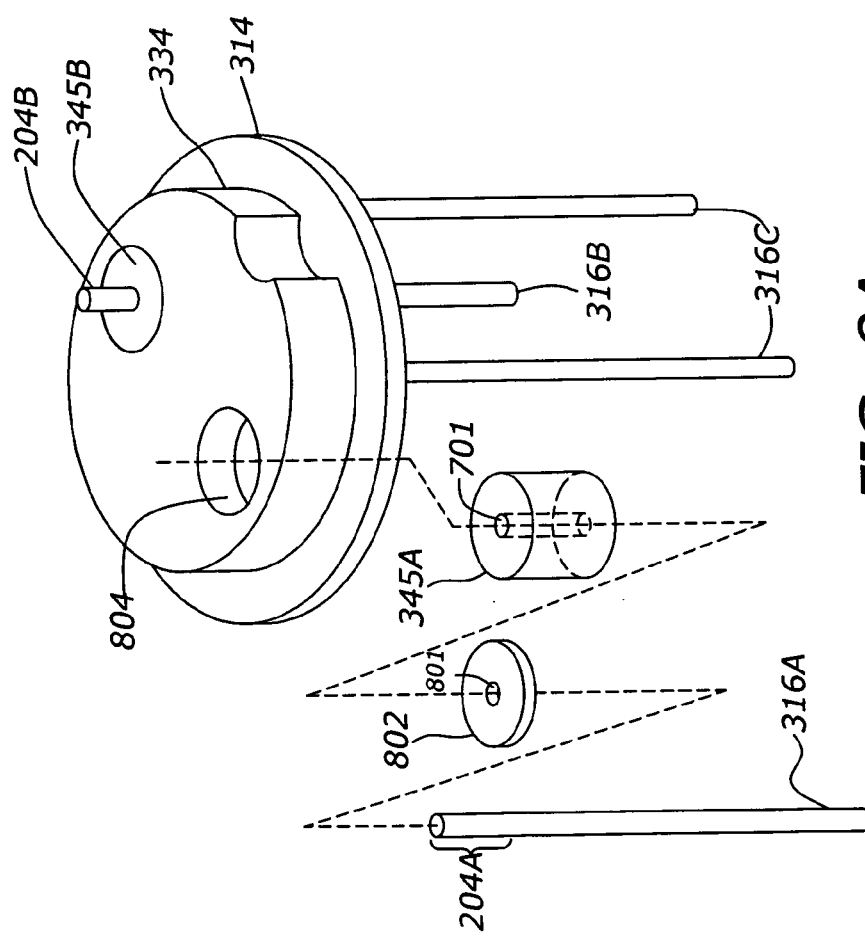
FIG. 8A is an exploded view of a semiconductor laser package without the can lid to illustrate the assembly of the pin and feedthrough into the header.

Referring now to FIG. 8A, an exploded view illustrating the assembly of the pin 316A, a glass cap 802, and the feedthrough 345A to the header 314 is illustrated.

In one embodiment of assembly, the pin 316A may first be inserted into the center of the cylindrical opening 804 in the header 314 and header flange 334. A desired molten dielectric is poured around the pin to fill in the cylindrical opening 804 and form the feedthrough 345A around the pin 316A. Molten glass is then poured onto the base of the package to cover around the bottom of the feedthrough around the pin and onto a bottom side of the header 314. The molten glass is allowed to cool into a solid state and forms a hermetic seal around the pin and the feedthrough to keep dirt and moisture out of the inside of the package.

In another embodiment of assembly, press fitting of solids are used with the glass cap being hermetically sealed at the end. The pin 316A is press fit into the cylindrical opening 701 of a solid feedthrough 345A. The feedthrough 345A and pin assembly 316A is press fit into the opening 804 in the header 314 and header flange 334. A cylindrical opening 801 in the center of the glass cap 802 is slid over the pin at the outer end opposite the post end 204. A solid glass cap 802 is slid along the pin 316A to meet the bottom of the header 314. The outer radius of the glass cap is larger than the outer radius R2 of the feedthrough in order to seal over the opening 804. The inner radius of the glass cap 802 is near the radius of the pin 316. The glass cap 802 can then be heated in a number of ways to hermetically seal around the opening 804 and the pin 316A.

Referring now to FIG. 8B, a magnified cross-section view of the final assembly in either case is illustrated. The pin 316A is inserted into the cylinder 701 of the feedthrough 345A to form the header post 204A. The feedthrough 345A is inserted into the opening 804 in the header 314 and the header flange 334. The glass cap 802 hermetically seals around opening 801 at the pin 316A and around the opening 804 and the feedthrough 345A in the bottom of the header 314 as illustrated.

The pin 316A being a metal provides a conductive path to a terminal of a device that may be mounted inside the package. The pin 316A may have an impedance (i.e. resistance, inductance, and capacitance) associated with it.

The feedthrough 345A is formed of a dielectric material to insulate the pin from shorting to the header and header flange and to provide impedance matching. The dielectric constant of the feedthrough material is important to provide impedance matching. The feedthrough impedance $Z_F$ is seen as a result of the pin extending through a grounded header 314 and header flange 334. This is similar to a coaxial cable with a center pin and an outer ground cylindrical shell used in seventy five ohm coaxial cable.

The feedthrough 345 can be designed in its dimensions (i.e., R1 and R2 or th; $H_{FT}$) and by the selection of dielectric materials for a given pin to provide a desired nominal feedthrough impedance $Z_F$ at a frequency or over a range of frequencies. The selection of the pin diameter and conductive material can also be used to alter the feedthrough dimension R1 and influence the feedthrough impedance. The selection of the thickness of the header and header flange can also be used to alter the feedthrough dimension $H_{FT}$ and influence the feedthrough impedance.

With or without the impedance controlled circuit 202, the header's feedthrough impedance $Z_F$ should be designed to match the impedance $Z_L$ of the semiconductor laser 332 to minimize reflections at high frequencies caused by impedance mismatches. The header's feedthrough impedance $Z_F$ is the impedance seen as a pin 316 feeds up through the feedthrough 345 into the header 314 and the header flange 334 and extending out into the header post 204. The feedthrough impedance can be designed with proper selection of materials and sizing of the feedthroughs 345.

Referring now to FIG. 9, a bottom view of a pin-out for a three and a four pin header is illustrated. Pins 316A and 316B feed through into the package to make electrical connections to optoelectronic devices such as the semiconductor laser 332 and the monitoring photodiode 330. In line with the center C of the package and perpendicular to the header is an optical axis of the light output 342 of the semiconductor laser 332. The pins 316A and 316B are equally offset from the center C in alignment on a y axis.

In FIG. 9, two pins 316C are illustrated. Pins 316C do not feedthrough past the header and into the inner chamber of the package. Pins 316C mechanically and electrically couple to the bottom of the header 314. Pins 316C are electrically coupled through the header 314 to the header flange 334. Pins 316C are usually coupled to ground in order to ground out the header 314, header flange 334, and the can or cap 312.

In a three pin header, only one of the two pins 316C illustrated in FIG. 9 is utilized in conjunction with the pins 316A and 316B. In a four pin header, both of the two pins 316C illustrated are utilized in conjunction with the pins 316A and 316B.

In the following discussion, the feedthrough type pins 316A and 316B are discussed without any further discussion of pins 316C. It being understood that at least one pin 316C exists that couples to the bottom of the header 314.

In order to use the same slanted window can 312 and conform to external optical interfaces, it is desirable to keep the light output 342 centered in the packaged semiconductor laser and in the window 318. However, the header flange 334 of the header 314 may be altered by moving the pins 316 while maintaining the desired dimensions of the feedthroughs 345 for impedance matching purposes. In the following discussion the feedthrough type pins are moved closer to center in order to reduce bond wire length and their inductance for better high speed performance without use of an impedance controlled circuit 202. But for noted exceptions, the photodiode and the semiconductor laser are generally mounted within the device package as is discussed previously with reference to FIG. 3D and discussed below with reference to FIGS. 13A–13B.

Referring now to FIGS. 10A and 10B, a modified header flange 334' of the header 314' is illustrated. The modified header flange 334' has one pin 316B and feedthrough 345B offset and moved closer to the semiconductor laser 332 while the other pin 316A and feedthrough 345A remain at the same standard position. From a bottom view with the header flange 334' flipped around sideways, the pins 316 appear spaced apart as illustrated in FIG. 10B. Pin 316B is offset closer to center C than pin 316A.

A bond wire 360F couples at one end to the header post 204B and at an opposite end to a pad of the semiconductor laser 332. With the pin 316B and feedthrough 345B offset and moved closer to the semiconductor laser 332, the bond wire 360F is shorter than it might otherwise be. The reduction in length of the bond wire reduces the inductance there between.

The feedthrough 345B is properly designed so that the feedthrough impedance $Z_F$ matches the input impedance $Z_L$ Of the semiconductor laser 332.

Referring now to FIGS. 11A and 11B, a modified header flange 334" of the header 314" is illustrated. The modified header flange 334" has both pins 316A and 316B and both feedthroughs 345A and 345B moved closer to the center C of the package as illustrated in FIG. 11B. Pins 316A and 316B have the same offset from center C along the y axis.

As before, the bond wire 360F couples at one end to the header post 204B and at an opposite end to a pad of the semiconductor laser 332. The reduction in length of the bond wire 360F reduces its inductance. The feedthrough 345B is properly designed so that the feedthrough impedance $Z_F$ matches the input impedance $Z_L$ of the semiconductor laser 332. Feedthrough 345A may be similarly designed to match the input impedance $Z_L$ of the semiconductor laser 332 or otherwise designed to match the output impedance of the photodiode. Impedance matching with the photodiode is not as important as it is with the semiconductor laser.

In order to accommodate the movement of pin 316A and the post 204A, the devices inside the package can be modified to maintain the center of the laser output 342.

In FIG. 11A, the submount area 331 of the photodiode 330 is modified to maintain the center of the laser output 342. A notch 1100 is cut into the submount portion 331"" of the photodiode 330"" so that it accepts the tighter position of the post 204A and pin 316A. A bond wire 360C' is coupled between the post 204A and the photodiode 330"". The length of bond wire 360C' is also reduced and lowers its inductance as a result. Otherwise similar labeled elements are similar to those of FIG. 10A.

Figure 12A:
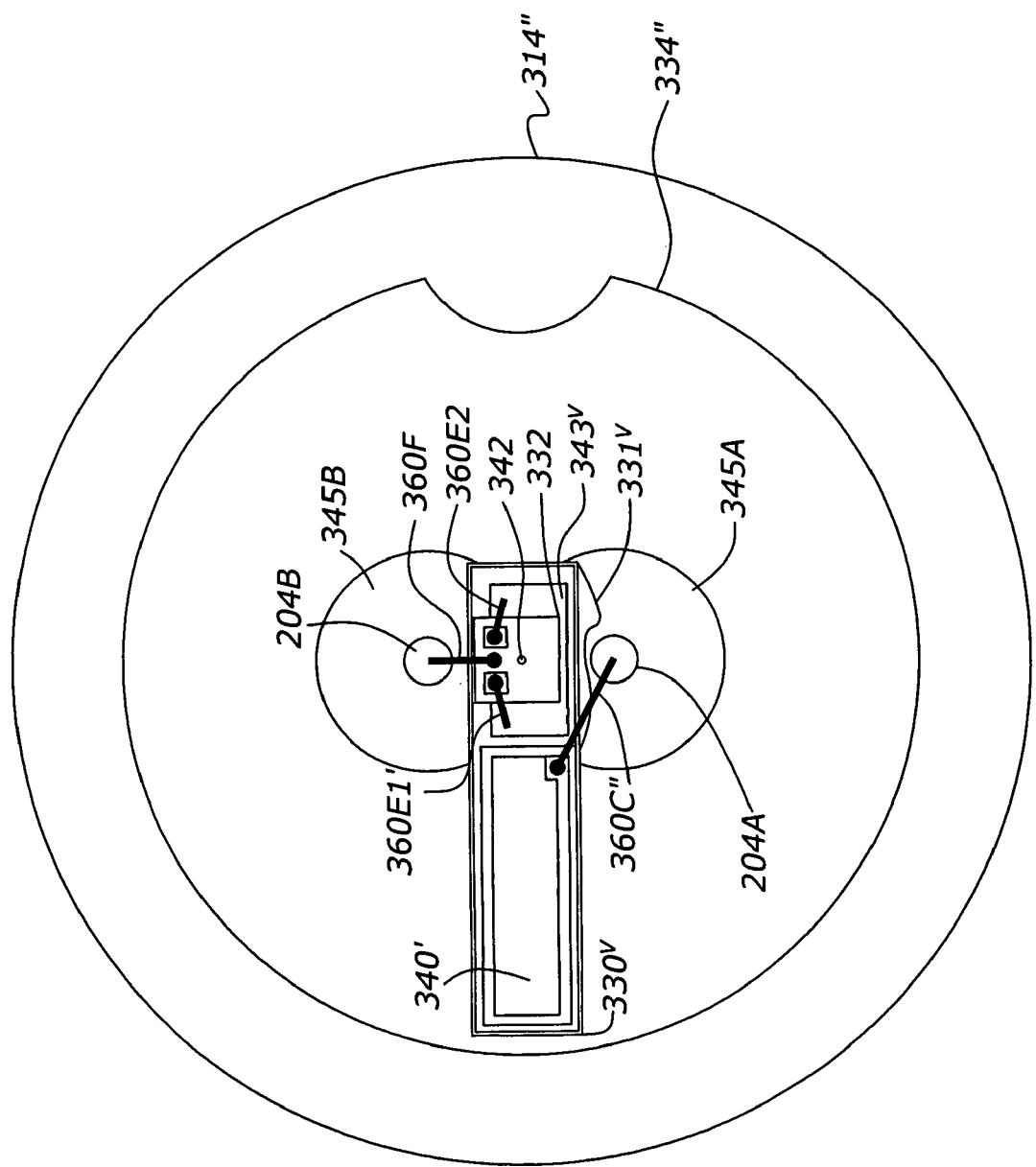
FIG. 12A is a magnified top view of the second alternate header with the second altered pin spacing and a photodiode and a second submount modified thereto for another embodiment of the packaged semiconductor laser.
Figure 12B:
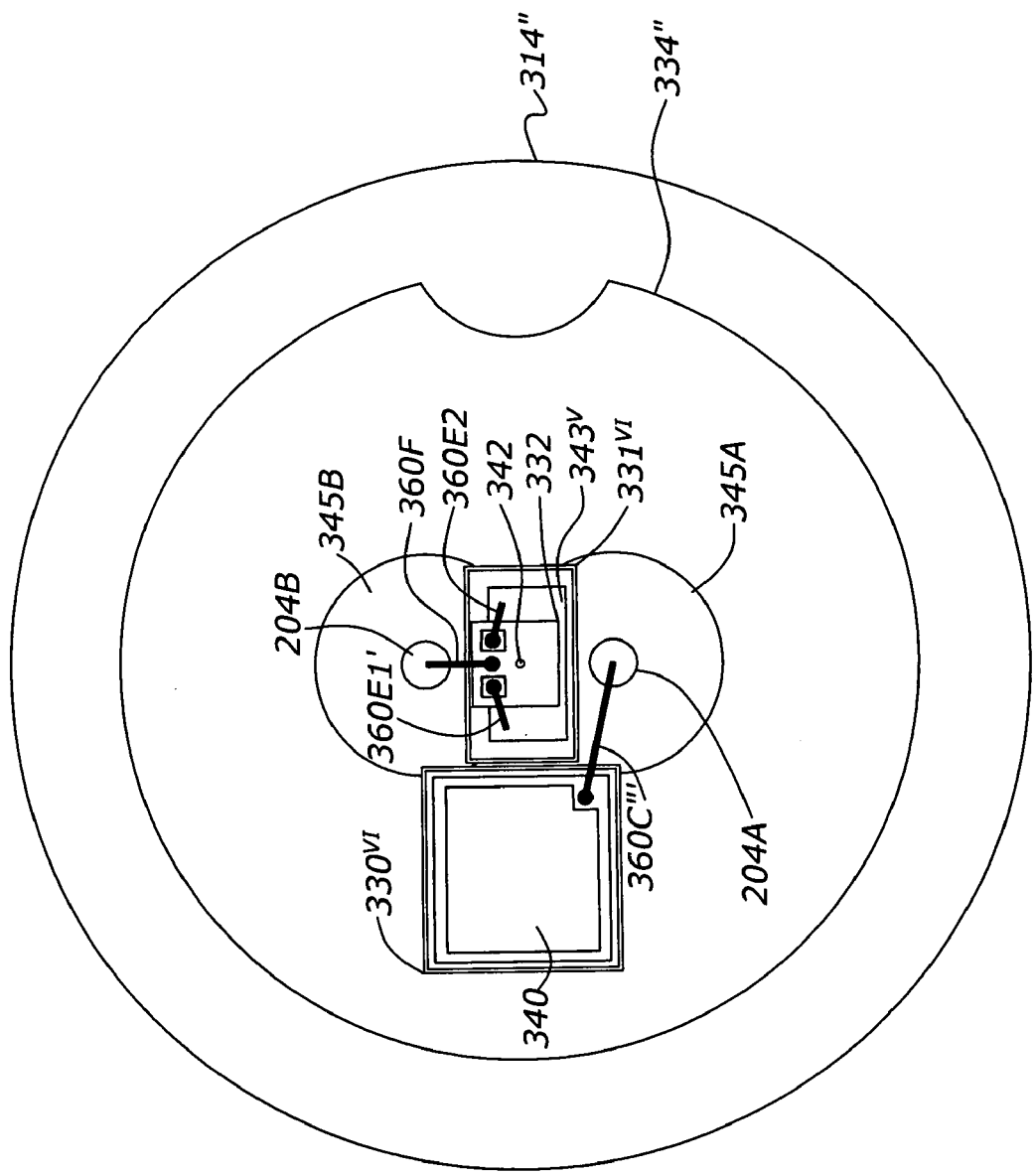
FIG. 12B is a magnified top view of the second alternate header with the second altered pin spacing and a third submount modified thereto separate and apart from the photodiode for another embodiment of the packaged semiconductor laser.

Referring now to FIGS. 12A–12B, alternate embodiments to the submount modification to that of FIG. 11A are illustrated with the same pin and header configuration of the device package.

In FIG. 12A, a thin submount 331$^V$ and photodiode 330$^V$ (i.e., they are narrow) are provided to maintain the center of the laser output 342. The light receiving area 340' although thinner is somewhat compensated by extending out the end of the photodiode. The submount 331$^V$ includes a wider contact 343$^V$ to which a bond wire 360E1' from the semiconductor laser 332 can couple. A bond wire 360C" is coupled between the post 204A and the photodiode 330$^V$. Otherwise similar labeled elements are similar to those of FIG. 11A.

The submount 331$^V$ and photodiode 330$^V$ are more readily manufacturable than making the notch 1100 in the submount portion 331"" as is illustrated in FIG. 11A. The scribe lines along the edge of the submount 331$^V$ and photodiode 330$^V$ are straight and can be scribed readily on a semiconductor wafer.

In FIG. 12B, a separate thin submount 331$^{VI}$ (i.e., it's narrow) is provided from that of a separate photodiode 330$^{VI}$ to maintain the center of the laser output 342. The light receiving area 340 of the photodiode 330$^{VI}$ remains the same as the original design. The submount 331$^{VI}$ includes the wider contact 343$^V$ to which the bond wire 360E1' can couple to as previously described. A bond wire 360C''' is coupled between the post 204A and the photodiode 330$^{VI}$. Otherwise similar labeled elements are similar to those of FIG. 11A.

The submount 331$^{VI}$ and photodiode 300$^{VI}$ are more readily manufacturable than making the notch 1100 in the submount portion 331"" as is illustrated in FIG. 11A. The scribe lines along the edge of the submount 331$^V$ and photodiode 330$^V$ are now straight and can be scribed readily on a semiconductor wafer. The light receiving area 340 of photodiode 330$^{VI}$ needs no compensation in FIG. 12B.

FIGS. 3A–3D illustrate the device package for the packaged semiconductor laser 300 as being a TO package with a four pin TO-header. It is understood that the number of pins and the header may vary depending upon the application and whether or not power monitoring is provided. To keep costs low, the header 314 can be a standard conventional header size dimensionally for a TO package.

Referring now to FIGS. 13A–13B, a three pin TO package for a packaged semiconductor laser 300' is illustrated. The packaged semiconductor laser may also be referred to herein as a packaged transmitter. The packaged transmitter 300' includes a slanted window can 1312, a header 1314, and three leads 316. The slanted window can 1312 includes a slant lid or angled top 1317, a glass window 1318, a window opening 1319, and a can tab 1320. The can tab 1320 mates with a rectangular slot 1322 in the header 1314 for proper alignment of the slant lid 1317 with the header 1317.

Referring now to FIG. 13B, a cut away side view of the packaged transmitter 300' is illustrated. The glass window 1318 is hermetically sealed to the inside surface of the slanted window can 1312. More particularly, the glass window 1318 is hermetically sealed to the inside surface of the slant lid 1317 of the slanted window can 1312. The glass window 1318 has a circular shape and a diameter to cover over the window opening 1319 of the slant lid 1317 to seal out dust and dirt. The hermetic seal between the glass window and the slanted window can 1312 further prevents moisture from seeping into the packaged transmitter.

Inside the packaged transmitter 300' is a silicon photodiode 1330 and a surface emitting semiconductor laser 1332, such as a vertical cavity surface emitting laser (VCSEL) 1332. The photodiode 1330 is attached to a header flange 1334 of the header 1314. The photodiode 1330 has a submount portion. The VCSEL 1332 is attached to a top surface of the submount portion of the photodiode 1330. The VCSEL 1332 is not mounted or attached to the header 1314 in order to keep short the wire bond lengths to the header posts.

The embodiments of the headers (i.e., headers 314, 314', and 314", referenced here by header 1314) have a header diameter $H_D$ and a header thickness $H_{TH}$. The header thickness $H_{TH}$ is a function of the header and the header flange. Adjustments in the header diameter $H_D$ and a header thickness $H_{TH}$ can vary the feedthrough impedance $Z_F$. Thus, to have the feedthrough impedance $Z_F$ match the impedance $Z_L$ of the semiconductor laser, the header diameter $H_D$ and a header thickness $H_{TH}$ may be appropriately selected. Additionally, the header and header flange are conductive and typically formed of a metal or alloy thereof. The type of metal or alloy may also influence the feedthrough impedance $Z_F$ such that this material selection may be taken into design consideration as well.

The packaged semiconductor laser 300' not only includes a semiconductor laser but provides a monitoring photodiode to allow for automatic power control (APC) of the output laser beam. The slanted window can or cap with its window is important in the provision of automatic power control (APC).

Figure 14A:
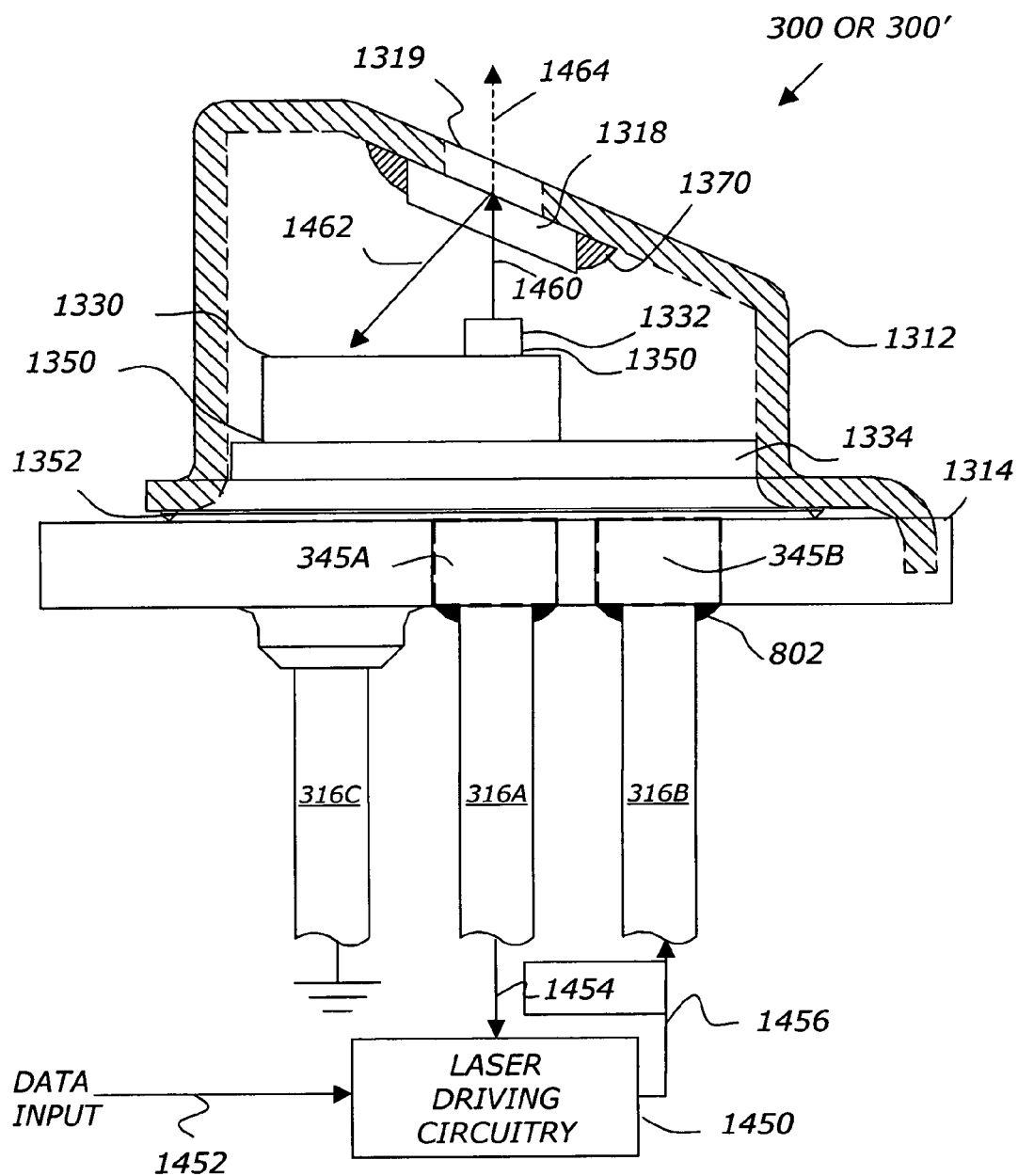
FIG. 14A is a block and ray diagram illustration of automatic power control of a surface emitting semiconductor laser and in response to power monitoring by a photodiode.

Referring now to FIG. 14A, a magnified cut away side view of the packaged transmitter 300 or 300' coupled to a block diagram of laser driving circuitry 1400 is illustrated. FIG. 14A illustrates the function of the slanted window can or cap. As illustrated in FIG. 14A, the slanted window can or cap supports the window 1318 on an angle to normal, above and aligned with the semiconductor laser 32 to receive a laser beam output from the semiconductor laser 1332. The window 1318 in the slanted window can or cap functions as a beam splitter to proportionally split the incident laser beam 1460 it receives from the semiconductor laser 1332.

A deflected portion 1462 of the incident laser beam 1460 is deflected or reflected by the window 1318 to the photodiode 1330. A non-deflected portion 1462 of the incident laser beam 1460 is transmitted through the window 1318 outside of the packaged laser transmitter 300 or 300'. The deflected portion 1462 is used to monitor the output power in the non-deflected portion 1462 as they are proportional to each other. The laser driver circuitry in response to monitoring the power in the deflected portion 1462, adjusts the drive current provided to the semiconductor laser and the power of the laser beam 1460.

The packaged transmitter 300 or 300' and laser driving circuitry 1450 are assembled together as part of a fiber optic transceiver module. The photodiode 1330 is attached to the header flange 1334 using a die attach epoxy 1350. The VCSEL 1332 attaches to the submount portion of the photodiode 1330 using a die attach epoxy as well. The die attach epoxy 1350 is a conductor allowing an electrical contact to be made between the VCSEL 1332 and a first contact pad of the submount portion of the photodiode 1330. Similarly the die attach epoxy 1350 allows an electrical contact to be made between the photodiode 1330 and the header flange 1334. The slanted window can 1312 is coupled to the header 1314 by a weld seal 1352. The glass window 1318 is attached to a back surface of the slant lid 1317 by the hermetic seal 1370.

The three leads 316 are separately labeled 316A, 316B, and 316C in FIG. 14A to describe the electrical connections between the packaged transmitter 300 OR 300' and the laser driving circuitry 1450. Lead 316C couples to ground at one end and the header flange 1334 at an opposite end. One of the bond wires couples between a first contact pad of the submount portion of the photodiode 1330 and the header flange 1334. One of two terminals of the VCSEL 1332 electrically couples to the header flange 1334. Lead 316A couples to a terminal of the photodiode 1330 at one end and a monitoring input of the laser driving circuitry 1450 at another end. A photo current 1454 of the photodiode 1330 couples to the laser driving circuitry 1450 through lead 316A. Lead 316B is coupled to the output of the laser driving circuitry 1450 at one end and a second terminal of the VCSEL 1332 at an opposite end. The laser driving circuitry 1450 provides a laser drive current 1456 to the VCSEL 1332 to turn it on and off through lead 316B. The laser driving circuitry 1450 receives a data input 1452 in order to modulate data onto an optical output of the packaged transmitter 300 or 300'.

When an external power source is provided to the packaged transmitter 300 or 300' and the laser driving circuitry 1450, the VCSEL 1332 and photodiode 1330 can be powered up and be actively operating. In this case, the VCSEL 1332 generates a laser beam 1460 which is coupled into the glass window 1318. The glass window 1318 acts as a beam splitter and reflects a portion of the power of the laser beam 1460 towards the photodiode 1330 as indicated by the reflected beam 1462. The remaining power of the laser beam 1460 propagates through the glass window 1318 becoming the output beam 1464 of the packaged transmitter 300 or 300'. As in the case of every beam splitter, the power of the output beam 1464 is reduced from the power of the laser beam 1460 generated by the VCSEL 1332 by the amount of power in the reflected beam 1462.

The laser driving circuitry 1450 monitors the photo current 1450 of the photodiode 1330 in order to generate an appropriate laser drive current 1456 to automatically maintain a relatively constant power output in the output beam 1464 when the VCSEL 1332 is in an on state.

FIG. 14B illustrates a magnified cross-sectional view of a portion of an embodiment of the window 1318. The window includes a substrate material 1470, such as glass, quartz, or plastic. The substrate material 1470 may have a first material layer 1472 and/or a second material layer 1474 on either side or both sides of the substrate material 1470. That is, the window 1318 illustrated in FIG. 14B may include the substrate 1470 and the material layer 1472, the substrate 1470 and the material layer 1474, or the substrate 1470 and the materials layers 1472 and 1474. Each of the material layers 1472 and/or 1474 may be formed of a thickness proportional to the wavelengths of the light that desire reflecting and/or transmission. The material layers 1472 and/or 1474 may be standard dielectric coating materials to allow transmission and deflection of light in one direction while reflecting light in another direction. That is, material layer 1472 in conjunction with the substrate layer 1470 and the material layer 1474 may provide beam splitting to light in a laser beam exiting from the semiconductor laser. The material layer 1474 may have an antireflection coating to keep light outside the package from entering into the package.

The material layer 1472 and or the material layer 1474 provides reflection of an incoming light beam 1466 into the reflected output light beam 1466'. The material layer 1472 and or the material layer 1474 allow a portion of the light beam 1460 from the semiconductor laser to pass through the window 1318 as the output light beam 1464. That is, the material layer 1472 and or the material layer 1474 allow the light beam 1460 from the semiconductor laser to be power split into a transmission portion 1464 and a deflection portion 1462 as illustrated.

FIG. 14C illustrates a magnified cross-sectional view of a portion of another embodiment of the window, window 1318'. The window 1318' includes the substrate material 1470, such as glass, plastic quartz or other optical material. The window 1318' further includes a plurality of layers on one or both sides of the substrate 1470. A first plurality of layers may be alternating pairs of material layers 1472a–1472n on an outer side of the substrate 1470. A second plurality of layers may be alternating pairs of material layers 1474a–1474n on an inner side the substrate material 1470. The first plurality and the second plurality need not be alternating pairs of material layers but multiple layers. That is, the window 1318' illustrated in FIG. 14C may include the substrate 1470 and the first plurality of pairs of alternating material layers 1472a–1472n, the substrate 1470 and the plurality of alternating pairs of material layers 1474a–1474n, or the substrate 1470 and the plurality of alternating pairs of material layers 1472a–1472n and 1474a–1474n on each respective side of the substrate.

Each of the plurality of material layers 1472a–1472n and/or 1474a–1474n may be formed of a thickness proportional to the wavelengths of the light that desire beam splitting. The alternating pairs of material layers 1472a–1472n and/or 1474a–1474n may be standard dielectric coating materials to allow beam splitting.

The plurality of material layers 1472a–1472n and/or the plurality of material layers 1474a–1474n provide reflection for the incoming light beam 1466 into the reflected light beam 1466'. The plurality of alternating pairs of material layers 1472a–1472n and or the plurality of alternating pairs of material layers 1474a–1474n allow the light beam 1460 from the semiconductor laser to be power split into a transmission portion 1464' and a deflection portion 1462' as illustrated.

Referring now to FIG. 15A, an exploded view of a Fiber Optic Transceiver Module 1500 is illustrated. FIGS. 15A–15B illustrates how a packaged semiconductor laser or transmitter 1510 is assembled into an optical block 1502. The packaged semiconductor laser or transmitter 1510 is the packaged semiconductor lasers 300 or 300' and their embodiments previously described.

The Fiber optic module 1500 includes an optical block 1502, a transmit printed circuit board (PCB) 1506, a receive printed circuit board PCB 1508, an optional internal shield 1509, a packaged transmitter 1510, a packaged receiver 1511, a cover 1519, an alignment plate 1551, a nose receptacle 1552, a nose shield 1553, and a base 1555. The alignment plate 1551 provides alignment between the optical block 1502 and a fiber optic cable plugged into the nose receptacle 1552. The nose receptacle 1552 includes an optical fiber opening 1572 to receive an optical fiber connector and hold the optical fiber substantially fixed and aligned in place. The nose shield 1553 includes an opening 1574 for insertion over the nose receptacle 1552 and is conductive to reduce EMI.

The packaged transmitter 1510 and packaged receiver 1511 are optoelectronic devices. An optoelectronic device is a device which can convert or transduce light or photons into an electrical signal or an electrical signal into light or photons. The packaged transmitter 1510 includes a vertical cavity surface emitting laser (VCSEL) 1590 that converts an electrical signal into light or photons. The packaged receiver 1511 is a packaged photodetector, including a photodetector 1592 that detects or receives light or photons and converts them into an electrical signal and is also preferably package in a TO can. The packaged transmitter 1510 is inserted into an opening 1564 in the optical block 1502 and epoxied thereto. The packaged receiver 1511 is inserted into an opening 1563 in optical block 1502 and epoxied thereto.

The packaged transmitter 1510 has terminals 1560 to couple to through-holes of the transmit PCB 1506. The terminals 1560 are soldered to make an electrical connection to the transmit PCB 1506. The transmit PCB 1506 includes electrical components 1512 such as the laser driver circuitry and pins 1513. The electrical components 1512 control the packaged transmitter 1510 and buffer the data signal received from a system through pins 1512 for transmission over an optical fiber.

The packaged receiver 1511 has terminals 1561 to couple to through-holes of the receive PCB 1508. The terminals 1561 are soldered to make an electrical connection to the receive PCB 1508. The receive PCB 108 includes electrical components 1516 such as a receiver integrated circuit (transimpedance amplifier and post amplifier), and pins 1517. The electrical components 1516 control the packaged receiver 1511 and buffer the data signal received from an optical fiber.

Referring now to FIG. 15B, a cross-sectional view of the optical block 1502 is illustrated assembled in the fiber optic module 1500. The package transmitter 1510, the packaged receiver 1511, and the alignment plate 1551 are coupled to the optical block 1502. The optical block 1502 includes lenses 1520–1523 and reflectors 1524–1525. Lens 1523 is for collimating the light or photons diverging from the packaged transmitter 1510. Lens 1522 is for focussing the collimated light or photons into an optical fiber. Lens 1520 is for collimating the light or photons diverging out from the end of an optical fiber into the optical block 1502. Lens 1521 is for focusing the collimated light or photons into the packaged receiver 1511. Reflectors 1524–1525 are forty five degree angle facets formed in the optical block 1502 to provide total internal reflection and redirect the light rays between the optical fibers and the optoelectronic devices. The facets may be coated with a reflective surface or mirror surface to reflect light or photons off the reflective coated surface or facets having an optical grating surface to reflect photons. However, none of the elements of the optical block 1502 are used to redirect a light beam or ray back into the packaged transmitter 1510. That is, the lens 1523, reflector 1525, lens 1522 associated with the packaged transmitter 1510, are used to couple light forward into an optical fiber and not to reflect light back into the packaged transmitter 1510.

The packaged transmitter 1510 includes a semiconductor laser such as a vertical cavity surface emitting laser 1590 for generation of light or photons in response to electrical signals from the transmit PCB 1506.

Light or photons emitted by the packaged transmitter 1510 are coupled into lens 1523 and collimated onto the reflector 1525 at an incident angle I1 (angle with the perpendicular to reflector 1525 surface) of substantially forty five degrees. Reflector 1525 reflects the incident light or photons on a refraction angle R1 (angle with the perpendicular to reflector 1525 surface) equivalent to incident angle I1 of substantially forty five degrees. The reflected light or photons travel perpendicular to the incident light or photons towards the lens 1522. Lens 1522 focuses the light or photons from the packaged transmitter 1510 into an aligned optical fiber through an optical port 1567 in the alignment plate 1551. Thus, light or photons coupled or launched into an optical fiber, defining a first optical axis, are substantially perpendicular to the light or photons emitted and incident upon lens 1523 from the packaged transmitter 1510.

Figure 16A:
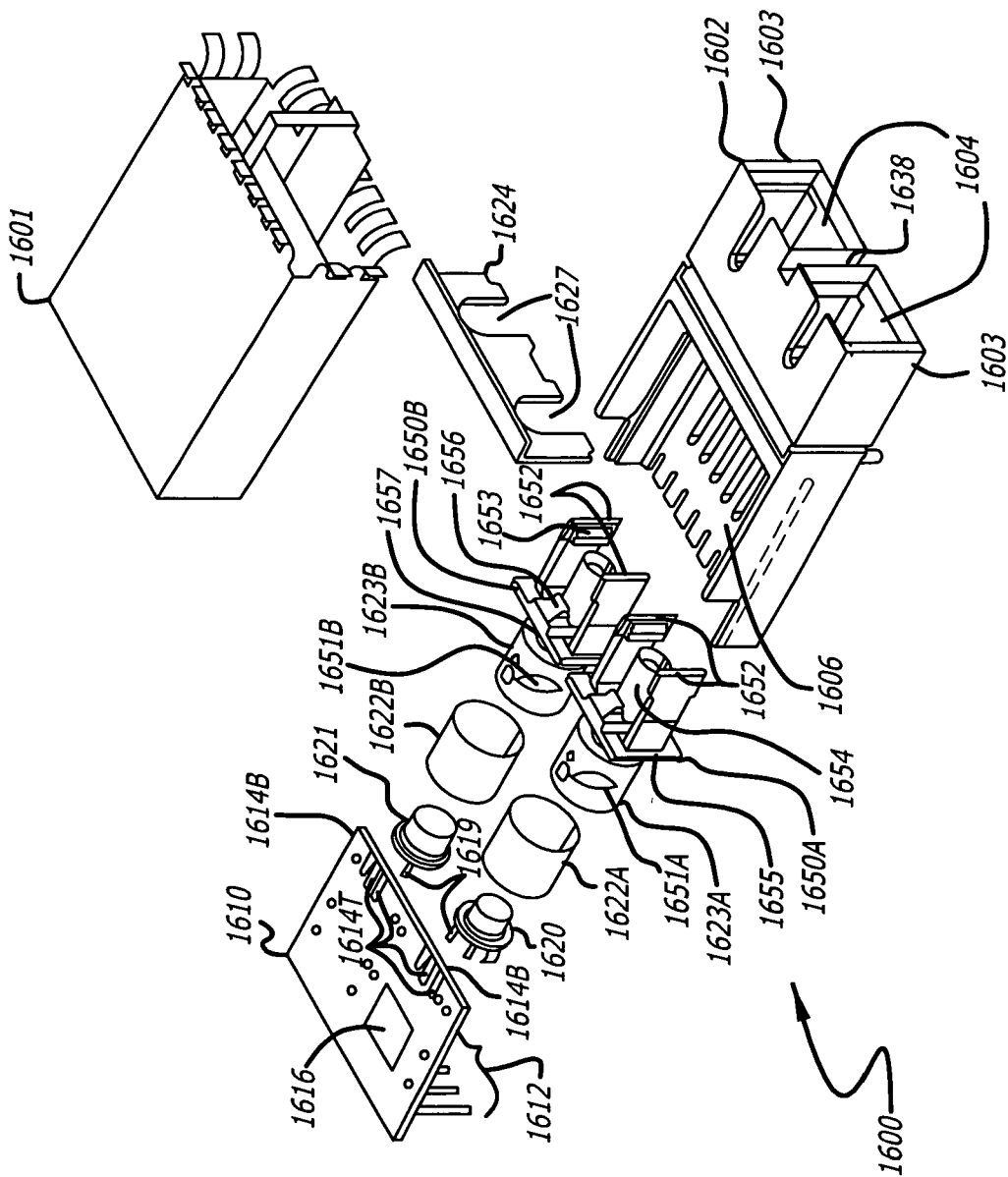
FIG. 16A is an exploded view of a second exemplary fiber optic module including a fiber optic plug with a lens to illustrate a higher order assembly of the packaged semiconductor laser.
Figure 16B:
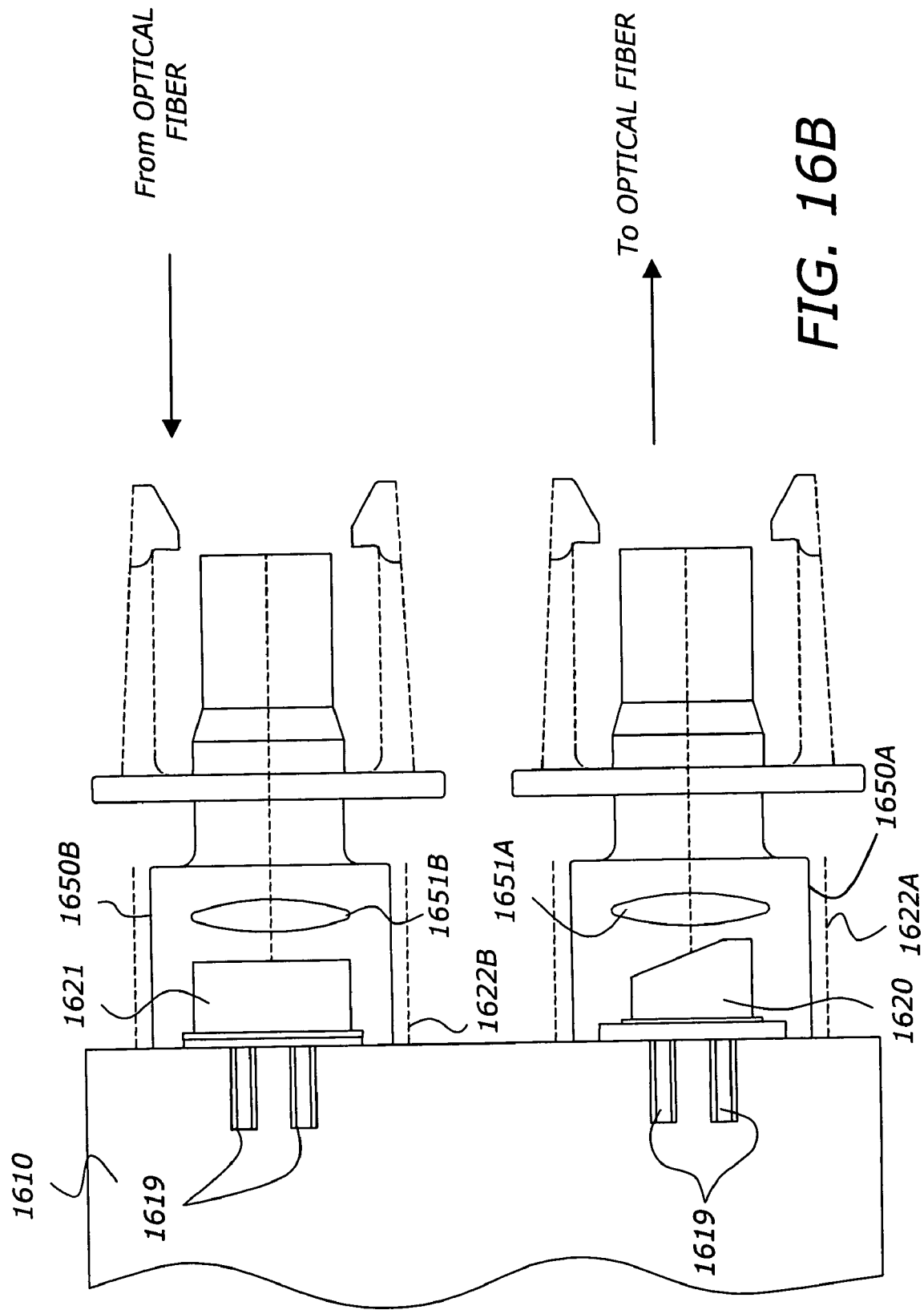
FIG. 16B is a cutaway side view of the packaged semiconductor laser mechanically coupled to the fiber optic plug including a lens as illustrated in FIG. 16A.

Referring now to FIG. 16A, an exploded view of a fiber optic module 1600 is illustrated. FIGS. 16A–16B illustrate how a packaged semiconductor laser or transmitter 1620 is assembled into an SC fiber optic plug or connector 1650A. The packaged semiconductor laser or transmitter 1620 is the packaged semiconductor lasers 300 or 300' and their embodiments previously described.

The fiber-optic module 1600 includes a cover 1601, a module chassis frame 1602, a printed circuit board (PCB) 1610, a packaged transmitter 1620, a packaged receiver 1621, a pair of shielding collars 1622A and 1622B, a pair of SC fiber optic plugs or connectors 1650A and 1650B, and a U-Plate 1624. The optical, electrical and opto-electronic components of the fiber-optic module 1600 are assembled into the module chassis frame 1602 and the cover 1601 is then fitted to the module chassis frame 1602.

The module chassis frame 1602 includes optical connector receptacles 1603 (including openings 1604), and a base 1606. The openings 1604 are SC optical connector openings for a duplex SC optical connection. The optical connector openings 1603 are separated by a slot 1638.

The packaged transmitter 1620 may include the vertical cavity surface emitting laser (VCSEL) for transmitting optical signals. The packaged receiver 1621 includes a photodiode for receiving optical signals. Each package of the package transmitter 1620 and the packaged receiver 1621 may be a standard TO package. Each of the packaged transmitter 1620 and receiver 1621 have one or more terminals 1619 which couple to the edge traces 1614 (1614T and 1614B) on each side of the printed circuit board 1610.

The printed circuit board 1610 includes one or more PCB signal pins 1612, edge traces 1614 on each side for mounting the packaged transmitter 1620 and the packaged receiver 1621, and one or more integrated circuits 1616 for processing signals between the signal pins 1612 and the packaged transmitter 1620 and the packaged receiver 1621. The one or more integrated circuits includes the laser driver circuitry previously discussed.

The SC fiber optic plugs or connectors 1650A and 1650B include a lens 1651A and 1651B mounted inside ports 1623A and 1623B, respectively. The lenses 1651A and 1651B are between the fiber ferrules and the TO-cans of the packaged transmitter 1620 and packaged receiver 1621 respectively. Each of the SC connectors 1650A and 1650B further includes a pair of snap lock clips 1652 each having a retaining protrusion 1653, ferrule barrels 1654, support struts 1656 in a front portion. Each of the SC connectors 1650A and 1650B further includes circular recesses 1657 between each of the headers 1623A and 1623B and their respective flanges 1655 in a rear portion. Each of the circular recesses 1657 mates with the U-shaped openings 1627 of the U-plate 1624.

The packaged transmitter 1620 is mounted inside the transmitter port 1623A of the SC fiber optic plug or connector 1650A to form a Transmitter Optical Subassembly. The shielding collar 1622A is slid over the port 1623A. The terminals 1619 of the packaged transmitter 1620 are then soldered onto the PCB 1610.

The packaged receiver 1621 is mounted inside the receiver port 1623B of the SC fiber optic plug or connector 1650B to form a Receiver Optical Subassembly. The shielding collar 1622B is slid over the port 1623B. The terminals 1619 of the packaged receiver 1621 are then soldered onto the PCB 1610.

The optical, electro-optical, and the electronic components are assembled into the module chassis frame 1602 before the cover 1601 encloses it. The front portion of the SC connectors 1650A and 1650B are inserted into the openings 1603 in the nose of the module chassis frame 1602. The U-plate 1624 is coupled to the module chassis frame so that its U-openings 1627 fit into the circular recesses 1657 of each respective connector 1650A and 1650B. The U-plate 1624 holds the subassembly of the optical and electrical components coupled into the module chassis frame 1602.

Referring now to FIG. 16B, a cross-sectional view of the SC optical plugs or connectors 1650A and 1650B is illustrated assembled in the fiber optic module 1600. The package transmitter 1620 is mounted inside the transmitter port 1623A of the SC fiber optic plug or connector 1650A. The shielding collar 1622A is around the port 1623A. The terminals 1619 of the packaged transmitter 1620 are soldered onto the PCB 1610. The packaged receiver 1621 is mounted inside the receiver port 1623B of the SC fiber optic plug or connector 1650B. The shielding collar 1622B is around the port 1623B. The terminals 1619 of the packaged receiver 1621 are soldered onto the PCB 1610.

The SC fiber optic plugs or connectors 1650A and 1650B include the lens 1651A and the lens 1651B mounted inside ports 1623A and 1623B, respectively. The lens 1651A is between the fiber ferrule 1654 and the packaged transmitter 1620. The lens 1651B is between the fiber ferrule 1654 and the packaged receiver 1621.

As previously discussed, the packaged transmitter 1620 includes the vertical cavity surface emitting laser (VCSEL) for generation of light or photons in response to electrical signals from the PCB 1610. Light or photons emitted by the packaged transmitter 1620 are coupled into lens 1651A, collimated and focused into an aligned optical fiber plugged into the SC fiber optic plug 1650A. Thus, light or photons from the packaged transmitter 1620 are coupled or launched into an optical fiber through the lens 1651A.

None of the elements of the SC fiber optic plug or connector 1650A are used to redirect a light beam or ray back into the packaged transmitter 1620. That is, the lens 1651A associated with the packaged transmitter 1620, is used to couple light forward into an optical fiber and not to reflect light back into the packaged transmitter 1620.

In summary, the following have been previously described herein: (1) A high-bandwidth TO-header based packaging for VCSEL; (2) A packaging scheme to arrange a VCSEL and a PCB circuit on a TO-header; (3) Impedance control of the feedthrough of the pins of the TO-header is, according to the resistance of the VCSEL; (4) An Impedance-controlled circuit as a medium for shortening of wire bonds to reduce the inductance of terminals of the device package; (5) The impedance-controlled circuit can have different impedance to match the resistance of different VCSELs used; (6) Thick wire bond wire (or ribbon wire) for reducing inductance introduced by wire bonding; (7) Packaging scheme for a VCSEL on a submount to provide a short bond wire length; (8) A submount to provide mechanical support to the VCSEL, and including a photodetector to generate a monitor current; (9) Electrical vias in the submount for shorting a ground contact of the VCSEL to the top of the header as a means of grounding the VCSEL; (10) A slanted TO-cap used for partial reflection of light from the laser back to the monitor photodetector for automatic power control application; and (11) The slanted TO-cap being oriented relative to the monitor photodiode (submount of the VCSEL) to get a maximum amount of monitoring current.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A packaged semiconductor laser transmitter for high modulation bandwidth, the packaged semiconductor laser transmitter comprising:
   a thin-outline device package including a header with a first pin and a second pin feeding through the header and a third pin coupled to a bottom of the header, the first pin being closer to a center of the header than the third pin, the first pin having a first feedthrough impedance and the second pin having a second feedthrough impedance;
   a first feedthrough between the first pin and the header;
   a second feedthrough between the second pin and the header;
   a photodetector and a submount mounted within the thin-outline device package, a bottom surface of the photodetector and a bottom surface of the submount coupled to the header, the photodetector having an electrical contact on a top surface with a first input impedance;
   a semiconductor laser mounted within the thin-outline device package, a bottom surface of the semiconductor laser coupled to a top surface of the submount, the semiconductor laser having an electrical contact on a top surface with a second input impedance;
   a first bondwire with a first length coupled between a post of the first pin and the electrical contact of the semiconductor laser;
   a second bondwire with a second length coupled between a post of the second pin and the electrical contact of the photodetector; and
   wherein the first pin being closer to the center of the header than the third pin to minimize the first length and an inductance of the first bondwire.

2. The packaged semiconductor laser transmitter of claim 1, wherein
   the first pin is closer to the center of the header than the second pin and the first length and the inductance of the first bondwire is less than the second length and an inductance of the second bondwire, respectively.

3. The packaged semiconductor laser transmitter of claim 1, wherein the first pin and the second pin are closer to the center of the header than the third pin to minimize the first length and the inductance of the first bondwire and to minimize the second length and an inductance of the second bondwire.

4. The packaged semiconductor laser transmitter of claim 3, wherein the first pin and the second pin are spaced equally from the center of the header along an axis.

5. The packaged semiconductor laser transmitter of claim 3, wherein the submount includes a notch to accept a position of the second pin and to center a laser output of the semiconductor laser within the thin-outline device package.

6. The packaged semiconductor laser transmitter of claim 3, wherein the photodetector and the submount are thin to accept a position of the second pin and to center a laser output of the semiconductor laser within the thin-outline device package.

7. The packaged semiconductor laser transmitter of claim 3, wherein the submount is thin to accept a position of the second pin and to center a laser output of the semiconductor laser within the thin-outline device package.

8. The packaged semiconductor laser transmitter of claim 1, wherein the submount elevates and mechanically supports the semiconductor laser above the header at a level substantially equal to a height of the post of the first pin to further minimize the first length and the inductance of the first bondwire.

9. The packaged semiconductor laser transmitter of claim 1, wherein the photodetector and the submount are integrated together.

10. The packaged semiconductor laser transmitter of claim 1, wherein the first feedthrough impedance of the first pin substantially matches the second input impedance of the semiconductor laser.

11. The packaged semiconductor laser transmitter of claim 10, wherein the second feedthrough impedance of the second pin substantially matches the first input impedance of the photodetector.

12. The packaged semiconductor laser transmitter of claim 10, wherein the first feedthrough impedance is provided by one or more of the selection of a diameter of the first pin, a conductive material of the first pin, a thickness of the header, dimensions of the first feedthrough, and a dielectric material of the first feedthrough.

13. The packaged semiconductor laser transmitter of claim 11, wherein the first feedthrough impedance is provided by one or more of the selection of a diameter of the first pin, a conductive material of the first pin, a thickness of the header, dimensions of the first feedthrough, and a dielectric material of the first feedthrough; and the second feedthrough impedance is provided by one or more of the selection of a diameter of the second pin, a conductive material of the second pin, a thickness of the header, dimensions of the second feedthrough, and a dielectric material of the second feedthrough.

14. The packaged semiconductor laser transmitter of claim 1 further comprising:

a slanted window can coupled to the header, the slanted window can having a glass window mounted to a slant lid to close a window opening, the slanted window can to allow a portion of a laser light from the semiconductor laser to pass out through the glass window and to redirect another portion of the laser light from the semiconductor laser to the photodetector for power monitoring and automatic power control of the semiconductor laser.

* * * * *